US011233034B2

(12) United States Patent
Keeth

(10) Patent No.: US 11,233,034 B2
(45) Date of Patent: Jan. 25, 2022

(54) STACKED MEMORY ROUTING TECHNIQUES

(71) Applicant: Micron Technology, Inc., Boise, ID (US)

(72) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/576,197

(22) Filed: Sep. 19, 2019

(65) Prior Publication Data

US 2020/0098730 A1   Mar. 26, 2020

Related U.S. Application Data

(60) Provisional application No. 62/734,018, filed on Sep. 20, 2018.

(51) Int. Cl.
*H01L 25/065* (2006.01)
*H01L 23/00* (2006.01)
(Continued)

(52) U.S. Cl.
CPC ............ *H01L 25/0657* (2013.01); *G11C 5/04* (2013.01); *G11C 5/06* (2013.01); *H01L 23/481* (2013.01);
(Continued)

(58) Field of Classification Search
CPC . H01L 25/0657; H01L 24/16; H01L 23/5283; H01L 25/18; H01L 24/17;
(Continued)

(56) References Cited

U.S. PATENT DOCUMENTS 6,686,615 B1 * 2/2004 Cheng ................... H01L 22/34
257/203
10,008,287 B2   6/2018 Dono et al.
(Continued)

FOREIGN PATENT DOCUMENTS

KR   20150025763   3/2015
TW     201709459   3/2017
(Continued)

OTHER PUBLICATIONS

"International Application Serial No. PCT US2019 051942, International Search Report dated Jan. 3, 2020", 4 pgs.
(Continued)

*Primary Examiner* — Matthew L Reames
(74) *Attorney, Agent, or Firm* — Schwegman Lundberg & Woessner, P.A.

(57) ABSTRACT

Techniques for signal routing between a host and dynamic random-access memory (DRAM) are provided. In an example, a routing layer for a dynamic random-access memory die (DRAM can include multiple through silicon via (TSV) terminations configured to electrically couple with TSVs of the DRAM, an intermediate interface area, and multiple routing traces. the multiple TSV terminations can be arranged in multiple TSV areas. The multiple TSV areas can be arranged in two columns. The intermediate interface area can include multiple micro-pillar bump terminations configured to couple, via a micro-pillar bump, with corresponding micro-pillar bump terminations of a semiconductor interposer. The multiple routing traces can couple control TSV terminations of the multiple TSV areas with a corresponding micro-pillar bump termination of the intermediate interface.

13 Claims, 24 Drawing Sheets

(51) Int. Cl.
  *H01L 23/528* (2006.01)
  *H01L 25/18* (2006.01)
  *H01L 25/00* (2006.01)
  *H01L 23/48* (2006.01)
  *G11C 5/04* (2006.01)
  *G11C 5/06* (2006.01)
  *G11C 5/02* (2006.01)

(52) U.S. Cl.
  CPC ........ *H01L 23/528* (2013.01); *H01L 23/5283* (2013.01); *H01L 24/16* (2013.01); *H01L 24/17* (2013.01); *H01L 25/18* (2013.01); *H01L 25/50* (2013.01); *G11C 5/025* (2013.01); *G11C 5/063* (2013.01); *H01L 2224/16146* (2013.01); *H01L 2224/16147* (2013.01); *H01L 2224/16227* (2013.01); *H01L 2224/17181* (2013.01); *H01L 2225/06513* (2013.01); *H01L 2225/06517* (2013.01); *H01L 2225/06541* (2013.01); *H01L 2225/06565* (2013.01); *H01L 2924/1436* (2013.01)

(58) Field of Classification Search
  CPC ........... H01L 23/481; H01L 2924/1436; H01L 2225/06513; H01L 2225/06517; H01L 2225/06541; H01L 2225/06565; H01L 2224/16227; H01L 2224/16146; H01L 2224/16147; H01L 2224/17181; G11C 5/04; G11C 5/06
  See application file for complete search history.

(56) References Cited

U.S. PATENT DOCUMENTS

| | | | |
|---|---|---|---|
| 2002/0113320 A1* | 8/2002 | Akram | H01L 24/06 257/778 |
| 2010/0091536 A1 | 4/2010 | Kim | |
| 2014/0048928 A1 | 2/2014 | Li et al. | |
| 2014/0133259 A1 | 5/2014 | Perego | |
| 2016/0124873 A1 | 5/2016 | Xu et al. | |
| 2016/0329303 A1 | 11/2016 | Ye et al. | |
| 2018/0284186 A1* | 10/2018 | Chadha | H01L 23/49816 |

FOREIGN PATENT DOCUMENTS

| | | |
|---|---|---|
| TW | 202018915 | 5/2020 |
| WO | 2020061318 | 3/2020 |

OTHER PUBLICATIONS

"International Application Serial No. PCT US2019 051942, Written Opinion dated Jan. 3, 2020", 5 pgs.

"Taiwanese Application Serial No. 108133739, Office Action dated Apr. 20, 2020", w English Translation, 23 pgs.

"Taiwanese Application Serial No. 108133739, Response filed Jul. 6, 2020 to Office Action dated Apr. 20, 2020", w English Claims, 12 pgs.

"International Application Serial No. PCT US2019 051942, International Preliminary Report on Patentability dated Apr. 1, 2021", 7 pgs.

* cited by examiner

STACKED MEMORY ROUTING TECHNIQUES

PRIORITY AND RELATED APPLICATIONS

This application claims the benefit of priority to Keeth, U.S. Provisional Patent Application Ser. No. 62/734,018, filed Sep. 20, 2018, titled, STACKED MEMORY ROUTING TECHNIQUES, which is hereby incorporated by reference herein in its entirety.

TECHNICAL FIELD

The following relates generally to operating a memory array and more specifically to direct routing techniques between a host and dynamic random-access memory (DRAM).

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random-access memory (RAM), read only memory (ROM), DRAM, synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile.

Improving memory devices, generally, may include increasing memory cell density, increasing read/write speeds, increasing reliability, increasing data. retention, reducing power consumption, or reducing manufacturing costs, among other metrics. Advancing memory technology has realized improvements for many of these metrics, but high reliability, low latency, and/or low-power devices tend to be expensive and may be difficult to scale. As the quantity of applications for high reliability, low latency, low-power memory increases, so too does the need for scalable, efficient, and cost-effective devices for such applications.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Some memory devices may include relatively long conductive paths between various components. Driving signals over long conductive paths may consume more power than driving signals over shorter paths and may lead to additional challenges and inefficiencies. Some memory technologies may include a plurality of channel terminals disbursed throughout a die area. Disbursing channel terminals throughout a die area may shorten a conductive path between the host device and a memory cell and may reduce the amount of power to access the memory cell. For example, some channel terminals may be positioned in an input/output (I/O) area (e.g., of the memory cell).

An array of memory cells in a memory device may be partitioned into a quantity of regions. Each region may include a plurality of banks of memory cells. Each region may be communicatively coupled to a host device using a channel that may include a quantity of data pins, a quantity of command/address pins, and a quantity of clock pins. The regions may be configured to minimize the distance between memory cells of the region and an interface with a host device. By minimizing or at least reducing a length of the signal path between the interface and the memory cells in the region, the memory device may be configured to achieve a high throughput of data (e.g., multiple TB/s) within an energy budget (e.g., less than three picofarads (pF) per access operation). In some memory devices, the memory die may have a centralized interface or ball-out for the memory cells. In such memory devices, the length of the signal paths between the interface and the memory cells may be longer.

Features of the disclosure introduced above are further described below in the context of an exemplary array (e.g., FIG. 1). Specific examples are then described for various examples or aspects of systems (e.g., FIGS. 2 and 9-21) and memory devices (FIGS. 3-8).

Figure 1:
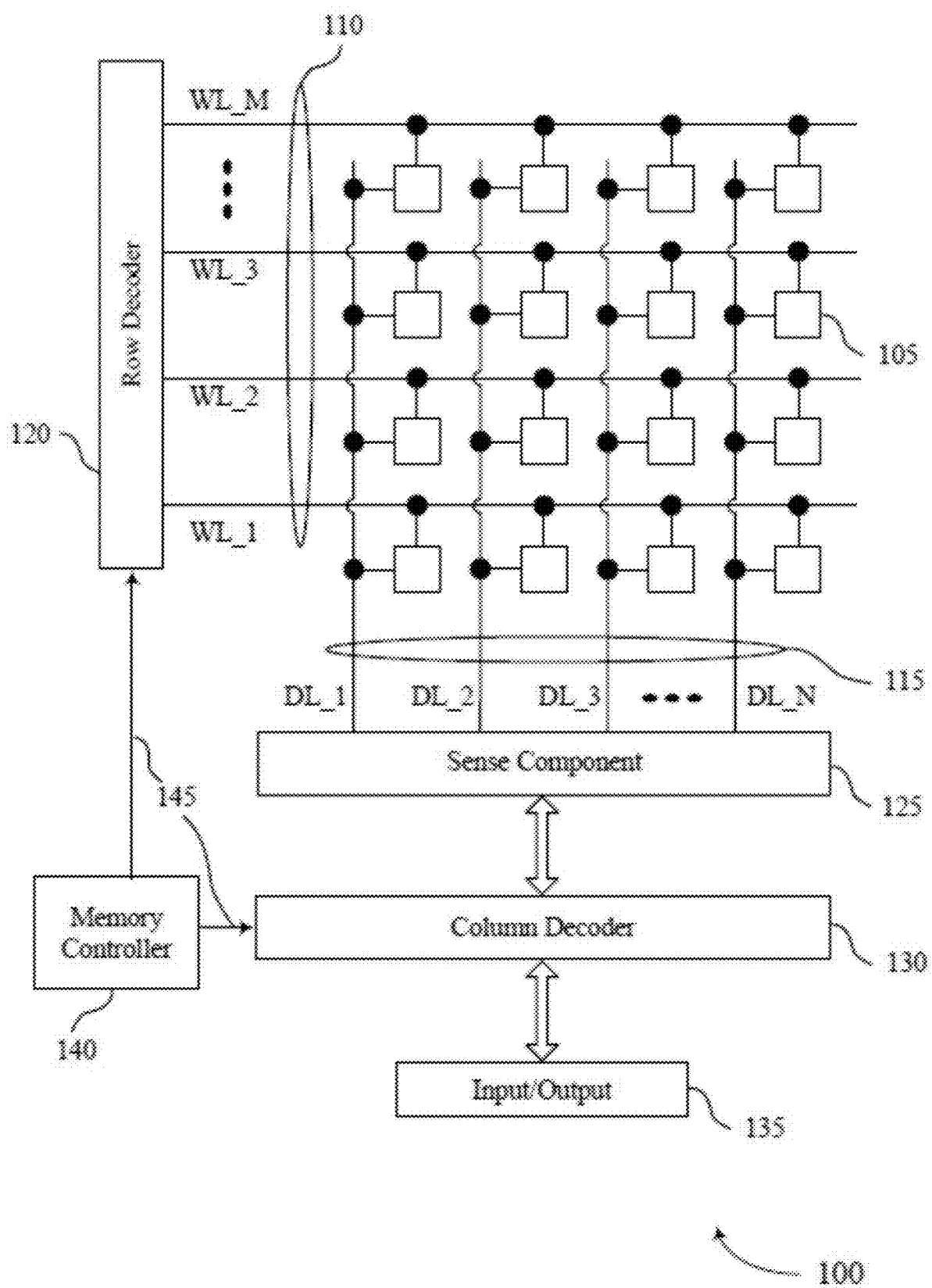
FIG. 1 illustrates an example of a memory die that supports features and operations in accordance with examples of the present disclosure.

FIG. 1 illustrates an example of the memory die 100 in accordance with various aspects disclosed herein. Memory die 100 may also be referred to as an electronic memory apparatus, a memory array, an array of memory cells, or a deck of memory cells, in some examples. The memory die 100 may include memory cells 105 that are programmable to store different states. Memory cells 105 may be arranged in one or more banks of memory cells that may be independently accessible. Each memory cell 105 may be programmable to store two states, denoted as a logic 0 and a logic 1. In some cases, memory cell 105 may be configured to store more than two logic states.

A memory cell 105 may store a charge representative of the programmable states in a capacitor; for example, a charged and uncharged capacitor may represent two logic states, respectively. DRAM architectures may use such a design, and the capacitor employed may include a dielectric material with linear or para-electric electric polarization properties as the insulator. FeRAM architectures may also employ such a design.

Operations such as reading and writing may be performed on memory cells 105 by activating access line 110 and digit line 115. Access lines 110 may also be known as word lines 110, and bit lines 115 may also be known digit lines 115. References to word lines and bit lines, or their analogues, are interchangeable without loss of understanding or operation. Activating a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 may be connected to a single word line 110, and each column of memory cells 105 may be connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. Additionally or alternatively, for example, each row of memory cells 105 may be arranged in one or more banks of memory cells.

In some architectures, the logic storing device of a cell, e.g., a capacitor, may be electrically isolated from the digit line by a selection component (not shown). The word line 110 may be connected to and may control the selection component. For example, the selection component may be a transistor and the word line 110 may be connected to the gate of the transistor. Activating the word line 110 may result in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. Row decoder 120 and column decoder 130 may receive a row address and a column address, respectively, for a memory cell located within one specific bank of memory cells. Additionally or alternatively, each bank of memory cells may be in electronic communication with a separate row decoder 120 and column decoder 130. For example, memory die 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing a memory cell 105, the cell may be read, or sensed, by sense component 125 to determine the stored state of the memory cell 105. For example, after accessing the memory cell 105, the capacitor of memory cell 105 may discharge onto its corresponding digit line 115. Discharging the capacitor may in some cases result from biasing, or applying a voltage, to the capacitor. The discharging may cause a change in the voltage of the digit line 115, which sense component 125 may compare to a reference voltage (not shown) to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—e.g., a logic value may be stored in the memory cell 105. Column decoder 130 or row decoder 120 may accept data, for example input/output 135, to be written to the memory cells 105. A memory cell 105 may be written by applying a voltage across the capacitor.

The memory controller 140 may control the operation (e.g., read, write, re-write, refresh, discharge, etc.) of memory cells 105 through the various components, for example, row decoder 120, column decoder 130, and sense component 125. Memory controller 140 may be a component of memory die 100 or may be external to memory die 100 in various examples. In some cases, one or more of the row decoder 120, column decoder 130, and sense component 125 may be co-located with the memory controller 140. Memory controller 140 may generate row and column address signals to activate the desired word line 110 and digit line 115. The memory controller 140 may activate the desired word line 110 and digit line 115 of a specific bank of memory cells via at least one channel traversing the memory die 100. Memory controller 140 may also generate and control various voltages or currents used during the operation of memory die 100. For example, it may apply discharge voltages to a word line 110 or digit line 115 after accessing one or more memory cells 105. Memory controller 140 may be coupled to memory cells 105 via channels 145. Channels 145 are illustrated in FIG. 1 as logical connections with row decoder 120 and column decoder 130, but those skilled in the art will recognize that other configurations may be employed. As described herein, memory controller 140 may exchange data (e.g., from a read or write operation) with cells 105 multiple times per clock cycle.

The memory controller 140 may also be configured to communicate commands, data, and other information with a host device (not shown). The memory controller 140 may use a modulation scheme to modulate signals communicated between the memory array and the host device. An I/O interface may be configured based on what type of modulation scheme is selected. In general, the amplitude, shape, or duration of an applied voltage or current discussed herein may be adjusted or varied and may be different for the various operations discussed in operating the memory die 100. Furthermore, one, multiple, or all memory cells 105 within memory die 100 may be accessed simultaneously or concurrently; for example, multiple or all cells of memory die 100 may be accessed simultaneously or concurrently during a reset operation in which all memory cells 105, or a group of memory cells 105, are set to a single logic state.

Figure 2A:
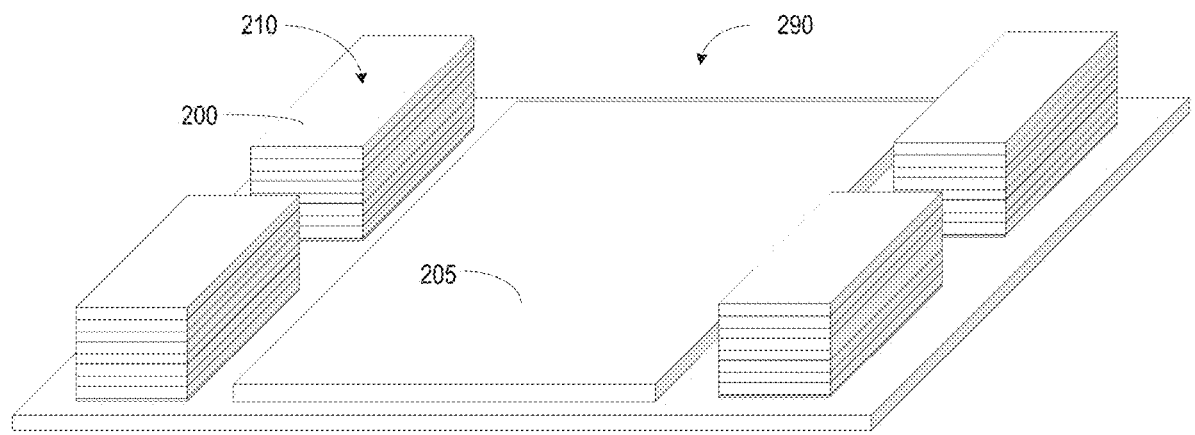
FIGS. 2A and 2B illustrate generally an example of a device that supports features and operations in accordance with examples of the present disclosure.
Figure 2B:
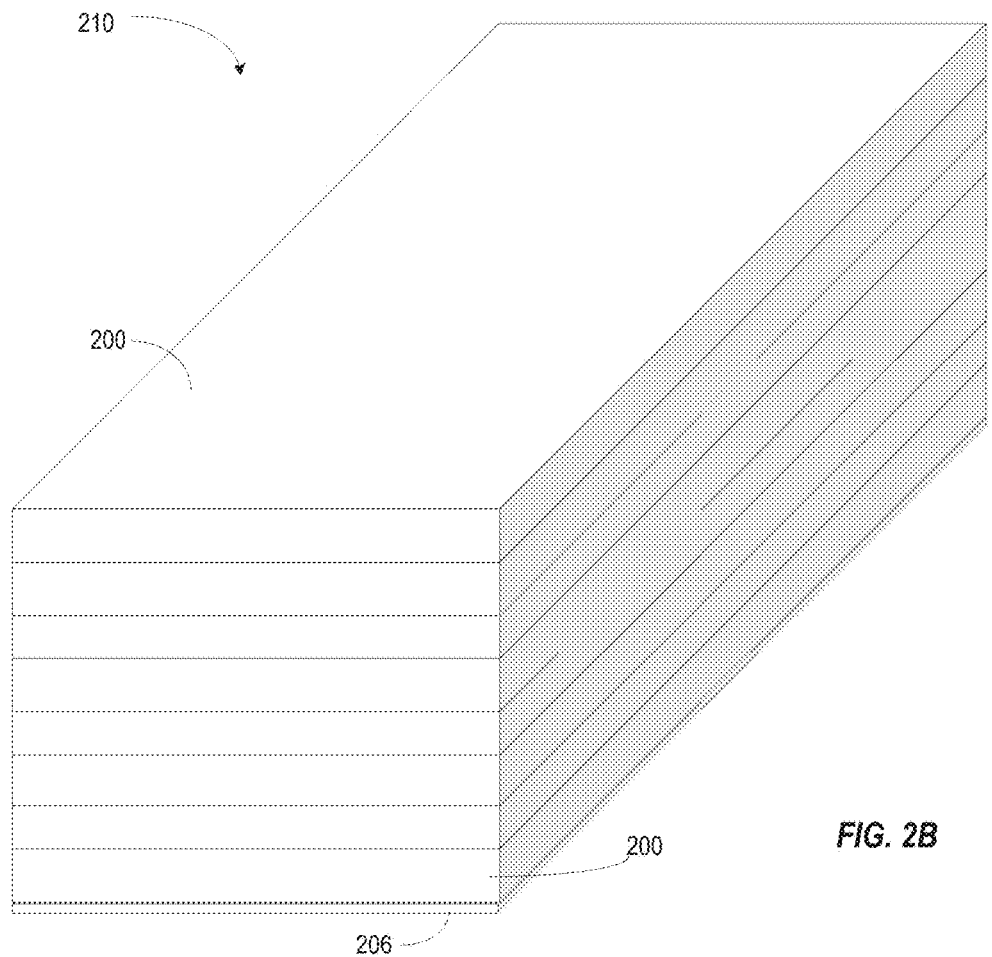

FIG. 2 illustrates an apparatus or system 290 that supports channel routing for a memory device in accordance with various examples disclosed herein. The system 290 may include a host device 205 and a plurality of memory devices 210. The plurality of memory device 210 may be examples of a finer grain memory device (e.g., finer grain DRAM or finer grain FeRAM, faster, power-efficient memory).

The host device 205 may be an example of a processor (e.g., a central processing unit (CPU), a graphics processing unit (GPU)), or a system on a chip (SoC). In some cases, the host device 205 may be a separate component from the memory device such that the host device 205 may be manufactured separately from the memory device. The host device 205 may be external to the memory device 210 (e.g., a laptop, server, personal computing device, smartphone, personal computer). In the system 290, the memory devices 210 may be configured to store data for the host device 205.

The host device 205 may exchange information with the memory devices 210 using signals communicated over signal paths. A signal path may be a path that a message or transmission may take from a transmitting component to a receiving component. In some cases, a signal path may be a conductor coupled with at least two components, where the conductor may selectively allow electrons to flow between the at least two components. The signal path may be formed in a wireless medium as in the case for wireless communications (e.g., radio frequency (RF) or optical). The signal paths may at least partially include a first substrate, such as an organic substrate of the memory device, and/or a second substrate, such as a package substrate (e.g., a second organic substrate) that may be coupled with at least one, if not both, of the memory device 210 and the host device 205. In some cases, the memory device 210 may function as a slave-type device to the host device 205, which may function as a master-type device.

In some applications, the system 290 may benefit from a high-speed connection between the host device 205 and the memory devices 210. As such, some memory devices 210 support applications, processes, host devices, or processors that have multiple terabytes per second (TB/s) bandwidth needs. Satisfying such a bandwidth constraint within an acceptable energy budget may pose challenges in certain contexts.

The memory devices 210 may be configured such that the signal path between the memory cells in the memory devices 210 and the host device 205 are as short as the material properties, operating environment, component layout, and application allow. For example, the memory devices 210 may be bufferless memory devices with a point-to-point connection between the host device and the memory array. In other examples, the data channels coupling a memory device 210 with the host device 205 may comprise a point-to-many-point configuration, with one pin of the host device 205 coupled with corresponding pins of at least two memory arrays. In another example, the data channels coupling a memory device 210 with the host device 205 may be configured to be shorter than other designs, such as other near-memory applications (e.g., a graphics card employing GDDR5-compliant DRAM).

The memory dies 200 of the memory devices 210 may be configured to work with multiple types of communication mediums 211 (e.g., substrates such as organic substrates and/or high-density interposers such as silicon interposers), The host device 205 may, in some cases, be configured with an interface or ball-out comprising a design (e.g., a matrix or pattern) of terminals.

In some cases, a buffer layer may be positioned between the memory dies 200 and the communication medium 211. The buffer layer may be configured to drive (e.g., redrive) signals to and from the memory dies 200. In some cases, the stack of memory dies 200 may be bufferless meaning that either no buffer layer is present or that a base layer does not include re-drivers, among other components. In certain examples of bufferless memory, a routing layer 206 may be positioned between the memory die 200, or stack of memory die 200 and the communication medium 211. In certain examples, the routing layer 206 can form a lower layer of a memory die 200. In certain examples, a bufferless memory stack 210 can include a lower most memory die 200 having a lower routing layer 206.

Figure 3:
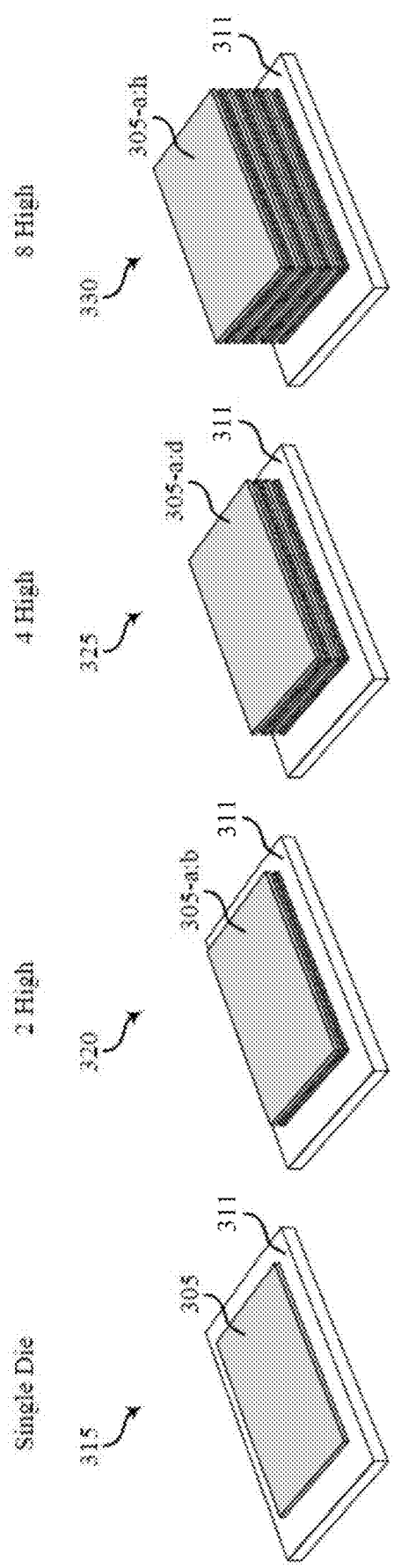
FIG. 3 illustrates an example of a memory die that supports features and operations in accordance with examples of the present disclosure.

FIG. 3 illustrates an example of a device or devices 300 in accordance with various examples disclosed herein. The memory devices 300 include at least one memory die 305 and a communication medium 311. The communication medium 311 may, in some cases, be an example of a substrate.

The memory die 305 may include a plurality of memory cells (as shown in and described with reference to FIG. 1) that may be programmable to store different logic states. For example, each memory cell may be programmed to store one or more logic states (e.g., a logic '0', a logic '1', a logic '00', a logic '01', a logic '10', a logic '11'). The memory cells of the memory dies 305 may use different storage technologies to store data including DRAM, FeRAM, phase change memory (PCM), 3D XPoint™ memory, NAND memory, or NOR memory, or a combination thereof. In some cases, a single memory device may include a first memory die that uses a first memory technology (e.g., DRAM) and a second memory die that uses second memory technology (e.g., FeRAM) different from the first memory technology.

The memory dies 305 may be an example of two-dimensional (2D) array of memory cells. In some cases, multiple memory dies 305 may be stacked on top of one another to form a three-dimensional (3D) array. A memory die may include multiple decks of memory cells stacked on top of one another. Such a configuration may increase the quantity of memory cells that may be formed on a single die or substrate as compared with 2D arrays. In turn, this may reduce production costs, or increase the performance of the memory array, or both. Each level of the array may be positioned so that memory cells across each level may be approximately aligned with one another, forming a memory cell stack. In some cases, the memory dies 305 may be stacked directly on one another. In other cases, one or more of the memory dies 305 may be positioned away from a stack of memory dies (e.g., in different memory stacks).

A first memory device 315 may be an example of a single die package that includes a single memory die 305 and a communication medium 311. A second memory device 320 may be an example of a two-high device that includes two memory dies 305-a and 305-b and a communication medium 311. A third memory device 325 may be an example of a four-high device that includes four memory dies 305-a through 305-d and a communication medium 311. A fourth memory device 330 may be an example of an eight-high device that includes eight memory dies 305-a through 305-h and a communication medium 311. A memory device 300 may include any quantity of memory dies 305, that may in some examples be stacked on top of a common substrate. The dies are shown as different shadings to more clearly demonstrate the different layers. In some cases, the memory dies in different layers may be configured similarly as adjacent dies in the memory device.

The memory dies 305 may include one or more vias (e.g., through-silicon vias (TSVs)). In some cases, the one or more vias may be part of internal signal paths that couple controllers with memory cells. The vias may be used to communicate between memory dies 305, for example, when the memory dies 100 are stacked on one another. Some vias may be used to facilitate communication between a controller of the memory device and at least some of the memory dies 305. In some cases, a single via may be coupled with multiple memory dies 305.

The communication medium 311 may be any structure or medium used to couple the memory dies 305 with a host device such that signals may be exchanged between the memory dies 305 and the host device. The communication medium 311 may be an example of a substrate, an organic substrate, a high-density interposer, a silicon interposer, or a combination thereof. The communication medium 311 may be positioned above, below, or to the side of a memory array. The communication medium 311 may not be limited to being underneath other components but may be in any configuration relative to the memory array and/or other components. In some instances, the communication medium 311 may be referred to as a substrate, however, such references are not limiting.

The communication medium 311 may be formed of different types of materials. In some cases, the communication medium 311 may be an example of one or more organic substrates. For example, the communication medium 311 may include a package substrate (e.g., an organic substrate) coupled with at least one if not both of the host device and the stack of memory dies 305. In another example, the communication medium 311 may include an organic substrate of the memory device and the package substrate. A substrate may be an example of a printed circuit board that mechanically supports and/or electrically connects components. The substrate may use conductive tracks, pads and other features etched from one or more layers of a conductive material (e.g., copper) laminated onto and/or between layers of a non-conductive material. Components may be fastened (e.g., soldered) onto the substrate to both electrically connect and mechanically fasten the components. In some cases, non-conductive materials of a substrate may be formed of a variety of different materials including phenolic paper or phenolic cotton paper impregnated with resin, fiberglass impregnated with resin, metal core board, polyimide foil, Kapton, UPILEX, polyimide-fluoropolymer composite foil, Ajinomoto build-up film (ABF), or other materials, or a combination thereof.

In some cases, the communication medium 311 may be a high-density interposer such as a silicon interposer. A high-density interposer may be configured to provide wide signal paths between connected components (e.g., a memory device and a host device). The high-density interposer may provide wide signal paths by offering a high quantity of channels to connect components. In some cases, the channels may be thin traces of connecter (e.g., copper), thereby making each individual channel lossy. Because each channel may be highly resistive, as the frequency of data transferred increases, the power needed to transfer the data may increase in a non-linear relationship with the frequency. Such characteristics may impose a practical frequency threshold (e.g., ceiling) that can be used to transmit data over a channel of the silicon interposer given an amount of transmit power. The channels may, in some cases, be independent of one another. Some channels may be unidirectional and some channels may be bidirectional.

Figure 4:
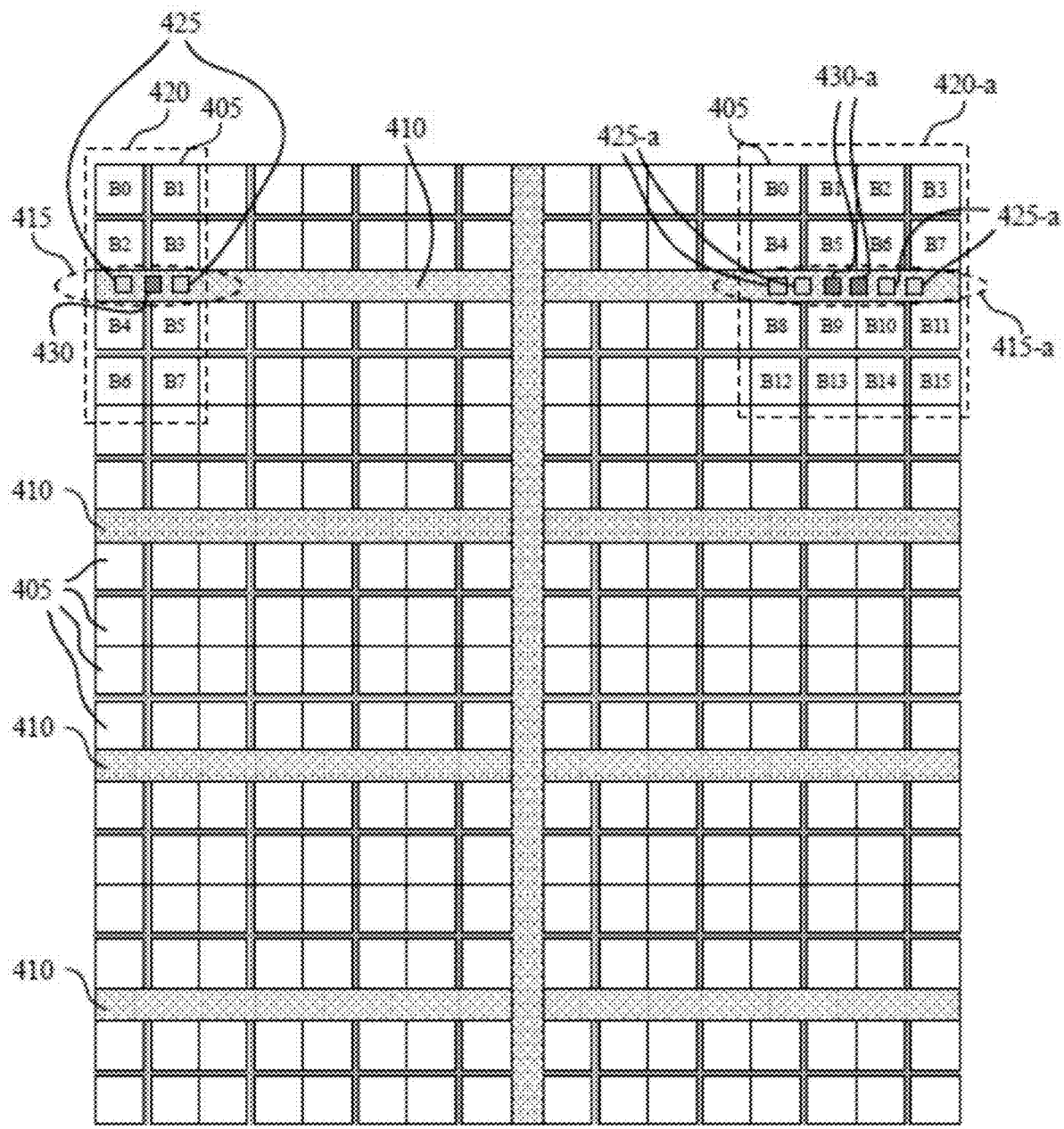
FIG. 4 illustrates an example of a memory die that supports features and operations in accordance with examples of the present disclosure.

FIG. 4 illustrates an example of a memory die 400 in accordance with various examples disclosed herein. The memory die 400 may be an example of a memory die 305 described with reference to FIG. 3. In some cases, the memory die 400 may be referred to as a memory array, an array of memory cells, or a deck of memory cells. The various components of the memory die 400 may be configured to facilitate high bandwidth data transfer between the host device and a memory device with which the memory die 400 is associated.

The memory die 400 may include a plurality of banks 405 of memory cells (as represented by the white boxes), a plurality of input/output (I/O) areas 410 (sometimes referred to as I/O stripes or I/O regions) traversing the memory cells of the memory die 400, and a plurality of data channels 415 that may couple the memory die 400 with the host device. Each of the banks 405 of memory cells may include a plurality of memory cells configured to store data. The memory cells may be DRAM memory cells, FeRAM memory cells, or other types of memory cells.

The memory die 400 may be divided into cell regions 420 associated with different data channels 415. For example, a single data channel 415 may be configured to couple a single cell region 420 with the host device. In some cases, the pins of the I/O channel may be configured to couple multiple cell regions 420 of the memory die 400 to power, ground, virtual ground, and/or other supporting components.

To provide a high throughput of data (e.g., multiple TB/s) between a host device (not shown) and the memory die 400, a path length between any given memory cell and the interface with the data channel 415 may be shorter compared to other previous solutions. In addition, shortening the data path between any given memory cell and the host device may reduce the power consumed during an access operation (e.g., read operation or write operation) of that given memory cell. Different architectures and/or strategies may be employed to reduce the size of the data path.

In some examples, the memory die 400 may be partitioned into a plurality of cell regions 420. Each cell region 420 may be associated with a data channel 415. Two different types of cell region 420 are illustrated, but the entire memory die 400 may be populated with any quantity of cell regions 420 having any shape. A cell region 420 may include a plurality of banks 405 of memory cells. There may be any quantity of banks 405 in a cell region 420. For example, the memory die 400 illustrates a first cell region 420 that may include eight banks 405 and a second cell region 420-a that may include sixteen banks 405-a.

Other quantities of banks in the cell region are possible, however (e.g., two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four, twenty-five, twenty-six, twenty-seven, twenty-eight, twenty-nine, thirty, thirty-one, thirty-two, etc.). The size of the cell region 420 may be selected based on the bandwidth constraints of the host device, the power needs of the host device or the memory device, the size of the data channel, a data rate associated with the data channel, other considerations, or any combination thereof. In some cases, the memory die 400 may be partitioned such that each cell region 420 may be the same size. In other cases, the memory die 400 may be partitioned such that the memory die 400 may have cell regions 420 of different sizes.

A data channel 415 (associated with a cell region) may include a quantity of pins for coupling the memory cells of the cell region 420 with the host device. At least a portion of the data channel 415 may comprise channels of the substrate (e.g., high-density interposer or organic substrate). The data channel 415 may include a data width specifying how many data pins 425 (sometimes referenced as DQ pins) are in the data channel 415. For example, a data channel may have a channel width of two data pins (e.g., X2 channel), four data pins (e.g., X4 channel), eight data pins (e.g., X8 channel), sixteen data pins (e.g., X1.6 channel), etc. The data channel may also include at least one command/address (C/A) pin 430. Each memory cell in the cell region 420 may be configured to transfer data to and from the host device using the pins 425, 430 associated with the cell region 420. The data channel 415 may also include a clock pin (e.g., CLK), and/or a read clock pin or a return clock pin (RCLK).

An I/O interface of the memory die 400 may be configured to support multiple channel widths (e.g., ×4, ×8, ×16, ×32, etc.). In some instances, to maintain data bandwidth, data throughput, or data accessibility, different modulation schemes may be used to communicate data across channels with different widths. For example, PAM4 may be used to modulate signals communicated across an X4 channel and NRZ may be used to modulate signals communicated across an X8 channel.

The plurality of I/O areas 410 may include a plurality of power pins and ground pins configured to couple the memory cells of the memory die 400 with power and ground. In some cases, the I/O areas 410 may include TSVs to communicate power signals and/or ground signals with memory dies that are positioned above or below the memory die 400.

The I/O areas 410 may include interfaces or terminals for the data channels 415. The interfaces or terminals may include a plurality of pins or pads that are configured to couple with signal paths. The signal paths may couple the memory cells of the region 420 with the channel 415. The I/O areas 410 may, in some cases, include TSVs to communicate signals (e.g., using the data channels 415) with memory dies that are positioned above or below the memory die 400.

The I/O areas 410 may, in some cases, bisect the banks 405 of memory cells in the cell region 420. In cases where the terminals for a channel are positioned in the I/O area 410, the length of the signal path for any individual memory cell in the region 420 may be shortened. The I/O areas 410 may be configured to bisect the regions 420. In some cases, the I/O areas 410 may split the banks 405 of the region 420 such that 50% of the banks 405 are on a first side of the I/O area 410 and 50% of the banks 405 are on a second side of the I/O area 410. In other examples, the I/O area 410 may bisect the region such that the split of banks 405 on either side of the I/O area 410 is unequal. In some cases, the regions 420 may be defined such that I/O area 410 bisects the region 420. The memory die 400 includes four I/O areas 410. In other examples, the memory die 400 may include other quantities of I/O areas (e.g., one, two, three, five, six, seven, eight, nine, ten, eleven, twelve, thirteen, fourteen, fifteen, sixteen, etc.).

Figure 5:
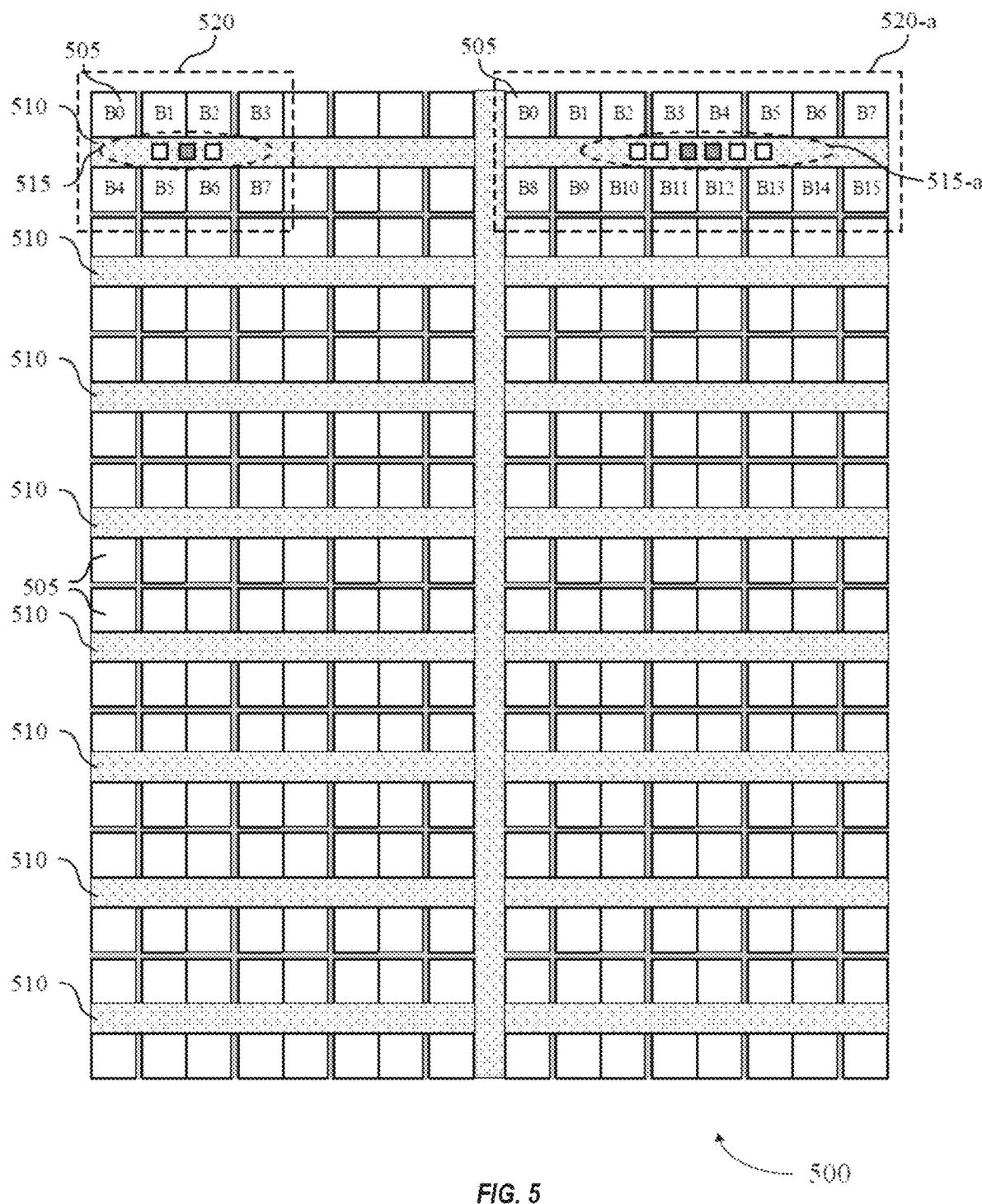
FIG. 5 illustrates an example of a memory die that supports features and operations in accordance with examples of the present disclosure.

FIG. 5 illustrates an example of a memory die 500 that includes eight I/O areas 510 bisecting the memory die 500. Using eight I/O areas 510 may alter some characteristics of the regions 520 as compared to the memory die 400. The memory die 500 may be an example of the memory die 400 and, as such, full descriptions of some features of the memory die 500 are not repeated here. Components with similar names and/or similar numbers may be embodied similarly.

In some cases, using eight I/O areas 510 may change the shape of the regions 520. The regions 520 may be configured to be bisected by an I/O area 510 (or the I/O areas 510 may be configured to bisect regions 520). In this manner, a length of signal paths that couples memory cells with channel terminals positioned in the I/O areas 510 may be minimized. As more. I/O areas extend across the memory die, fewer banks 505 may be positioned between I/O areas. If a single channel services a region 520 of banks 505, the shape of the region 520 may be different than a shape of the region 420. For example, the regions 520 and 520-a may include a single bank 505 positioned on each side of the I/O area 510, where the regions 420 and 420-a may include two banks positioned on each side of the I/O area 410.

Figure 6:
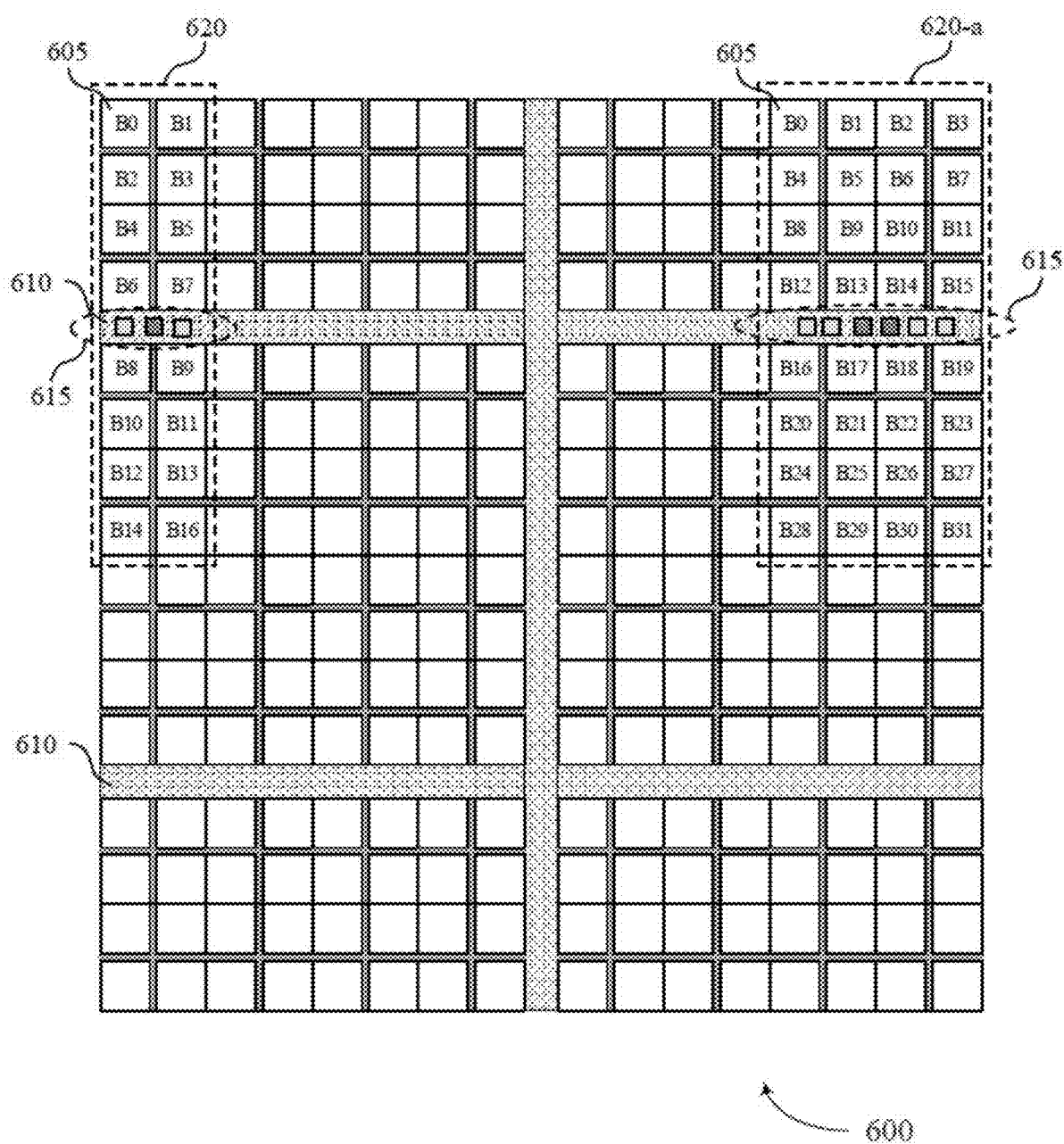
FIG. 6 illustrates an example of a memory die that supports features and operations in accordance with examples of the present disclosure.

FIG. 6 illustrates an example of a memory die 600 that includes two I/O areas 610 bisecting the memory die 600. Using two I/O areas 610 may alter some characteristics of the regions 620 as compared to the memory die 400. The memory die 600 may be an example of the memory die 400 and, as such, full descriptions of some features of the memory die 600 are not repeated here. Components with similar names and/or similar numbers may be embodied similarly.

In some cases, using two I/O areas 610 may change the shape of the regions 620. The regions 620 may be configured to be bisected by an I/O area 610 (or the I/O areas 610 may be configured to bisect regions 620). As fewer I/O areas extend across the memory die, more banks 605 may be positioned between I/O areas. If a single channel services a region 620 of banks 605, the shape of the region 620 may be different than a shape of the region For example, the regions 620 and 620-*a* may include four banks 605 positioned on each side of the I/O area 610, where the regions 420 and 420-*a* may include two banks positioned on each side of the I/O area 410.

Figure 7:
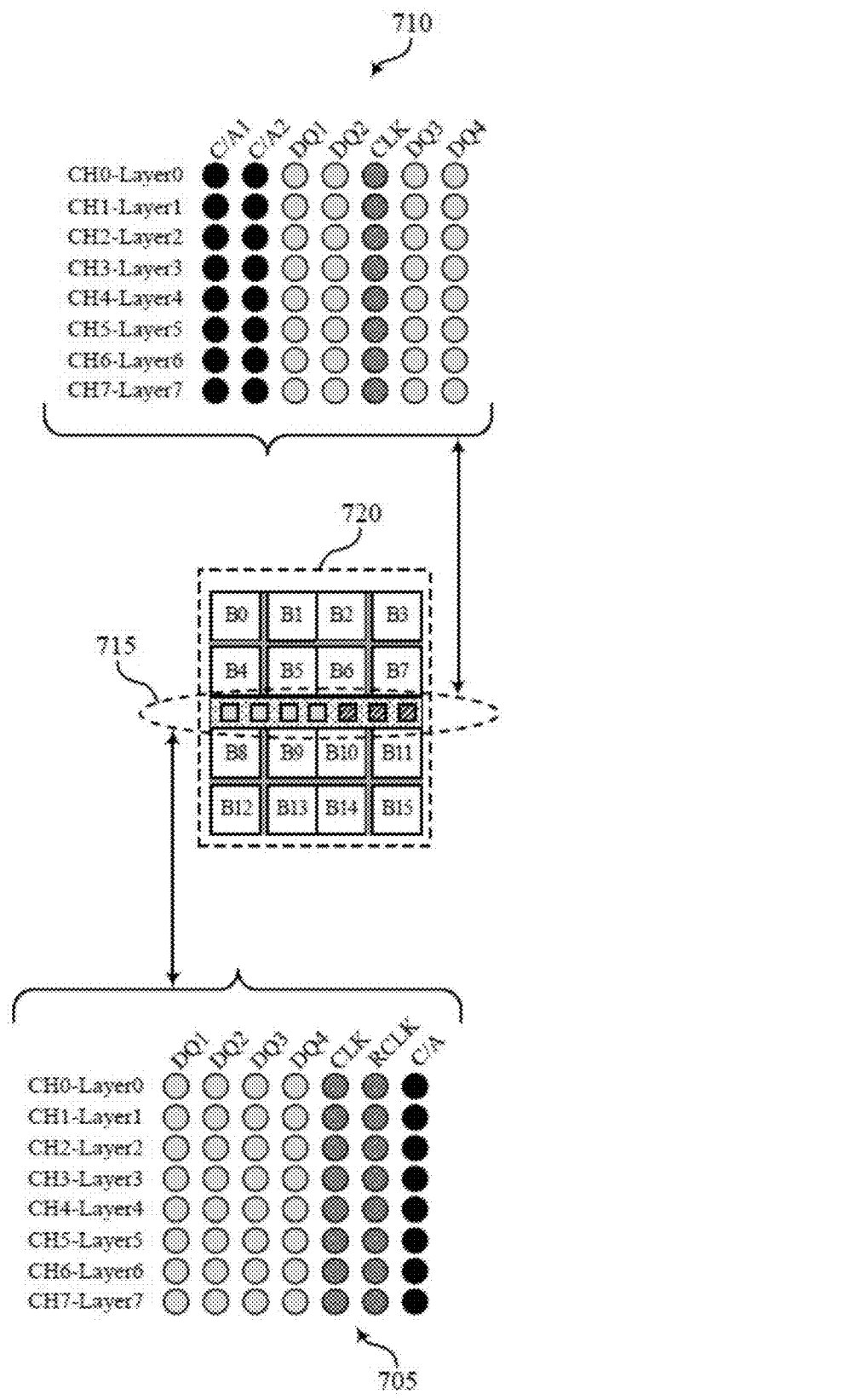
FIG. 7 illustrates examples of data channel configurations that support features and operations in accordance with examples of the present disclosure.

FIG. 7 illustrates an example of data channel configurations 700 in accordance with various examples disclosed herein. The data channel configurations 700 may include a first data channel configuration 705 and a second data channel configuration 710. For example, a first data channel configuration 705 illustrates a data channel 715 that services a cell region 720. The data channel 715 illustrates a data channel for a stacked memory device that includes eight layers and that has a channel width of four (e.g., there are four data pins). Each row of pins in the data channel 715 may be associated with a cell region in a separate layer.

The cell region 720 illustrates a cell region of a single layer. As such, the cell region 720 may be associated with a single row of the pins of the data channel 715. The quantity of pins in a data channel may be based on the quantity of layers in the memory device because a single data channel may be configured to couple with multiple layers.

In some examples, data channels may be coupled with a single cell region (e.g., without being coupled with another cell region) of any given layer or memory die. Although data channel 715 may be associated with cell regions in eight layers, any quantity of layers are possible. For example, the data channel 715 may be associated with cell regions in one, two, three, four, five, six, seven, eight, nine, ten, eleven, twelve, thirteen, fourteen, fifteen, or sixteen (or more) layers of the memory device.

The first configuration 705 of the data channel 715 may include four data pins (DQ0-DQ4), a clock pin (CLK), a read clock pin or return clock pin (RCLK), and a command/address pin (CA). In other cases, the data channel 715 may have a different rank or different channel width. In such situations, the quantity of data pins may be different. For example, the first configuration 705 of the data channel 715 may have a channel width of eight and may include eight data pins. Any quantity of data pins associated with a region are contemplated by this disclosure. The first configuration 705 of the data channel 715 may include any quantity of C/A pins. For example, the data channel 715 may include one, two, three, or four C/A pins. In some cases, the first configuration 705 of the data channel 715 may include an error correction code (ECC) pin for facilitating error detection and correction procedures.

The second configuration 710 of the data channel 715 may include four data pins (DQ0-DQ4), a clock pin (CLK), and two command/address pins (CA). In other cases, the data channel 715 may have a different rank or different channel width. In such situations, the quantity of data pins may be different. For example, the second configuration 710 of the data channel 715 may have a channel width of eight and may include eight data pins. Any quantity of data pins associated with a region are contemplated by this disclosure. The second configuration 710 of the data channel 715 may include any quantity of C/A pins. For example, the data channel 715 may include one, two, three, or four C/A pins. In some cases, the second configuration 710 of the data channel 715 may include an ECC pin for facilitating error detection and correction procedures.

Figure 8:
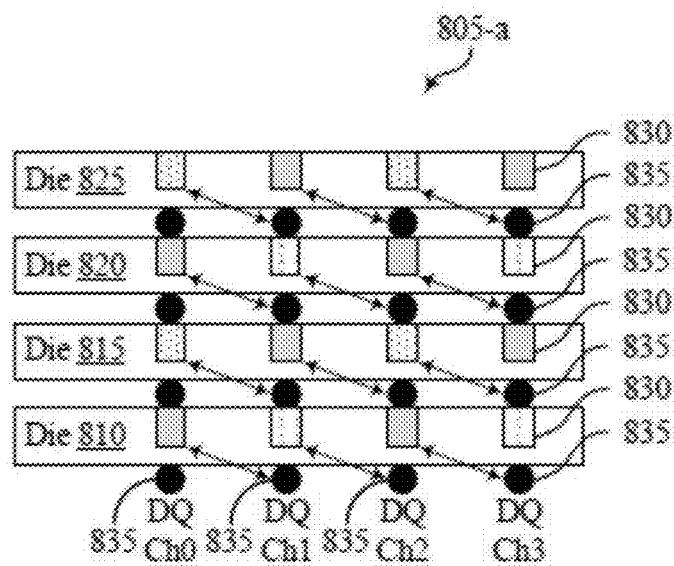
FIG. 8 illustrates examples of signal path routing that support features and operations in accordance with examples of the present disclosure.
Figure 8:
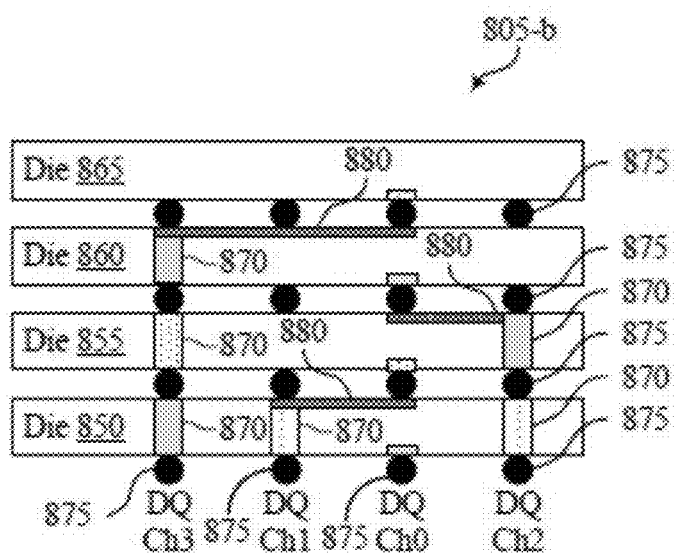

FIG. 8 illustrates examples of signal path routing 800 in a memory device 805. A first memory device 805-*a* includes a first signal path routing 800-*a* and a second memory device 805-*b* includes a second signal path routing 800-*b*. The examples of signal path routing show different options connecting TSVs between different dies of the memory device 805.

The first memory device 805-*a* may include a first memory die 810, a second memory die 815, a third memory die 820, and a fourth memory die 825. In other examples, the first memory device 805-*a* may include more or fewer memory dies than what is shown. A plurality of TSVs 830 may extend at least partially through each memory die 810, 815, 820, 825. Each die may include at least one pad 835 coupling the signal paths of the memory dies 810, 815, 820, 825 together. The stack of memory dies may include pads 835 at the bottom that couple with data channels (DQ Ch0, DQ Ch1, DQ Ch2, DQ Ch3).

In the first signal path routing 800-*a*, a TSV 830 may be coupled to a pad 835 of a neighboring column. For example, the TSV 830 in the DQ Ch0 column of the first memory die 810 may be communicatively coupled with the pad 835 that is under the first die 810 and in the DQ Ch1 column. In such a manner, the signal paths may include TSVs that are offset from one another in adjacent layers. In the first signal path routing 800-*a*, the memory device 805-*a* may not include signal paths that have TSVs that go up in the same column for more than one die at a time.

The second memory device 805-*b* may include a first memory die 850, a second memory die 855, a third memory die 860, and a fourth memory die 865. In other examples, the second memory device 805-*b* may include more or fewer memory dies than what is shown. A plurality of TSVs 870 extend at least partially through each die 850, 855, 860, 865. Each die includes at least one pad 875 coupling the signal paths of the dies 850, 855, 860, 865 together. The stack of memory dies may include pads 875 at the bottom that couple with data channels (DQ Ch0, DQ Ch1, DQ Ch2, DQ Ch3).

In the second signal path routing 800-*b*, each data channel terminates in the column associated with DQ Ch0. For example, the signal path for DQ Ch0 may be coupled with the first memory die 850 in the column associated with DQ Ch0. The signal path for DQ Ch1 may include a TSV 870 extending through the first memory die 850, a lateral conductive path 880, and couples with the second memory die 855 in the column associated with DQ Ch0. The signal path for DQ Ch2 may include TSVs 870 extending through the first memory die 850 and the second memory die 855, a lateral conductive path 880, and couples with the third memory die 860 in the column associated with DQ Ch0. The signal path for DQ Ch3 may include TSVs 870 extending through the first memory die 850, the second memory die 855, and the third memory die 860, a lateral conductive path 880, and couples with the fourth memory die 865 in the column associated with DQ Ch0.

The present inventor has recognized various layout schemes for robustly connecting memory stacks via parallel channel connections, as opposed to serial connections, using a bufferless routing layer and semiconductor interposer with a host interface. In some examples, the routing assembly is arranged to interface almost exclusively with bufferless memory stacks. Such routing layouts can split a conventional host interface to a memory stack into more than one connection array, and each of the multiple connection arrays can accommodate direct interposer routing such that routing traces of the interposer do not overlay TSV terminations of the memory stack.

In other examples, the routing layout can split the conventional host interface to a memory stack into more than one connection array. In certain examples, the connection arrays can include the control signals for both buffered and unbuffered memory stacks, and the power signals for buffered memory stacks. In some examples, the connection arrays can include the control signals and few if any power signals.

Figure 9:
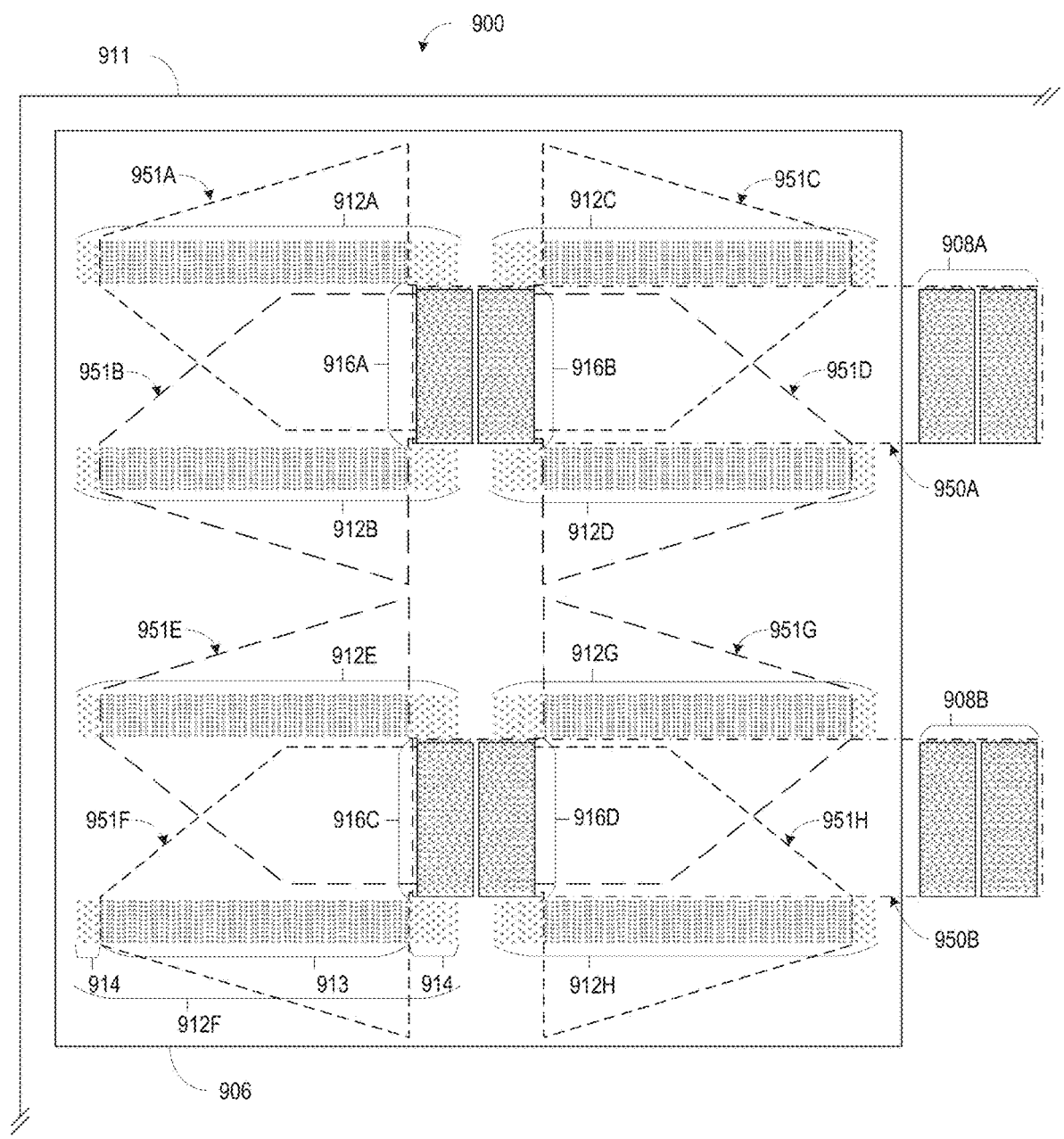
FIG. 9 illustrates generally and example layout of a direct routing layer for a stack of memory die according to various examples of the present

FIG. 9 illustrates generally a portion of an example of a routing layout for a routing assembly 907. The routing assembly 907 can directly, in a non-buffered manner, interface between a stack of memory die and a host interface 908. In certain examples, the routing assembly 907 can include a communication medium 911 and a lower routing layer 906 of a lowest memory die of the stack of memory die. FIG. 9 illustrates a top or bottom view of an overlay of a memory stack including a routing layer 906 with a portion of the communication medium 911. In the illustrated example, the periphery of the routing layer 906 can be coextensive with a footprint of the memory stack (e.g., FIG. 2, 210) imposed on the communication medium 911.

In the illustrated example, the memory stack can include a number of memory dies stacked and electrically coupled using through silicon vias (TSVs) of a memory interface. The memory interface can include a number of TSV areas 912 for interfacing channels of the memory die with a host device and with power. In the illustrated example, each TSV area 912 can include a first array area 913 including control TSVs, and power TSVs, and second and third TSV areas 914 including only power TSVs. In certain examples, the control TSVs can include TSVs for command signals, data signals, address signals, read clock signals, write clock signals, and other signals.

In the illustrated example, the memory stack can include 128 channels. Each channel can include 8 data I/O bits (DQ), 1 data bus inversion bit (DBI), 1 error correction code bit (ECC), 1 command/address bit (CA), 1 write clock bit (WCK), 1 read clock bit (RCK), 1 error detection code (EDC) bit, and 1 spare bit. It is understood that other channel configuration are possible without departing from the scope of the present subject matter. For example, some channel interface connections can be arranged in channel pairs such that each channel pair can share an WCK bit and an EDC bit. With such a configuration, the illustrated example can include 64 channel pairs, each channel pair can include 28 individual connections, such that a single memory die stack can include 1092 individual TSVs just for the control TSVs and not including the power TSVs.

In the illustrated example of FIG. 9, the control TSVs split between eight TSV areas 912A-H, and the host interface to the memory stack can divided into two connection arrays 908A-B. The routing layer 906 can provide direct connection between each TSV area 912 and a corresponding intermediate interface area 916 of the communication medium 911. FIG. 9 shows a routing area 950 of the communication medium 911 that defines the area occupied by electrical connections between each intermediate interface area 916 and a corresponding connection array 908 of the host interface. The routing areas 950 of the communication medium 911 can be arranged such that the signal routing of the communication medium does not overlay the TSV areas of the routing layer 906. In certain examples, the communication layer 911 can couple with the host at the host interface area(s) 908 using micro-bumps or micro-pillar bumps.

The routing layer 906 can include connection for the TSV areas and corresponding connections for the intermediate interface area 916. In certain examples, the corresponding connections for the intermediate interface area can include micro-pillar bumps to interface with connections of the communication medium 911 at the intermediate interface area 916. The routing layer can also include wire or trace connections (not shown in detail) between individual connections of the intermediate interface area and individual TSV connections at each of the TSV areas. In certain examples, routing areas 951, 952 of the routing layer can define limits for wire or trace connections between each TSV array 912 and a corresponding intermediate interface area 916. FIGS. 10-14 include wire and trace connection details. Due to the small dimensions of the trace connections, the trace connections are not shown in FIG. 9.

In certain examples, the ramped sides 953, 954 of the routing areas 951, 952 of the routing layer correspond to extents of the wire or trace connections between each TSV area 912 and corresponding intermediate interface area 916. In reference to the routing area 951 near the upper left corner of FIG. 9, a TSV connection close to the corresponding intermediate interface area 916 can have a trace path from the corresponding intermediate interface area 916 that bypass the TSV area 912 toward the upper limit of the routing layer 906 and then return to the TSV connection. A TSV connection further from the corresponding intermediate interface area 916 can have a trace path that extends parallel to the length of the TSV area 912 from the corresponding intermediate interface area 916 until the trace can angle toward the TSV connection. The trace may then bypass the TSV area 912 toward the upper limit of the routing layer 906, but not as far as the closer TSV connection. The trace can then return to the TSV connection. In certain examples, the trace paths are arranged to equalize the length of each trace of the routing layer 906. In certain examples, a trace, or a group of traces may include a path with a serpentine pattern to further assist in equalizing path lengths of the traces of the routing layer 906.

Figure 10:
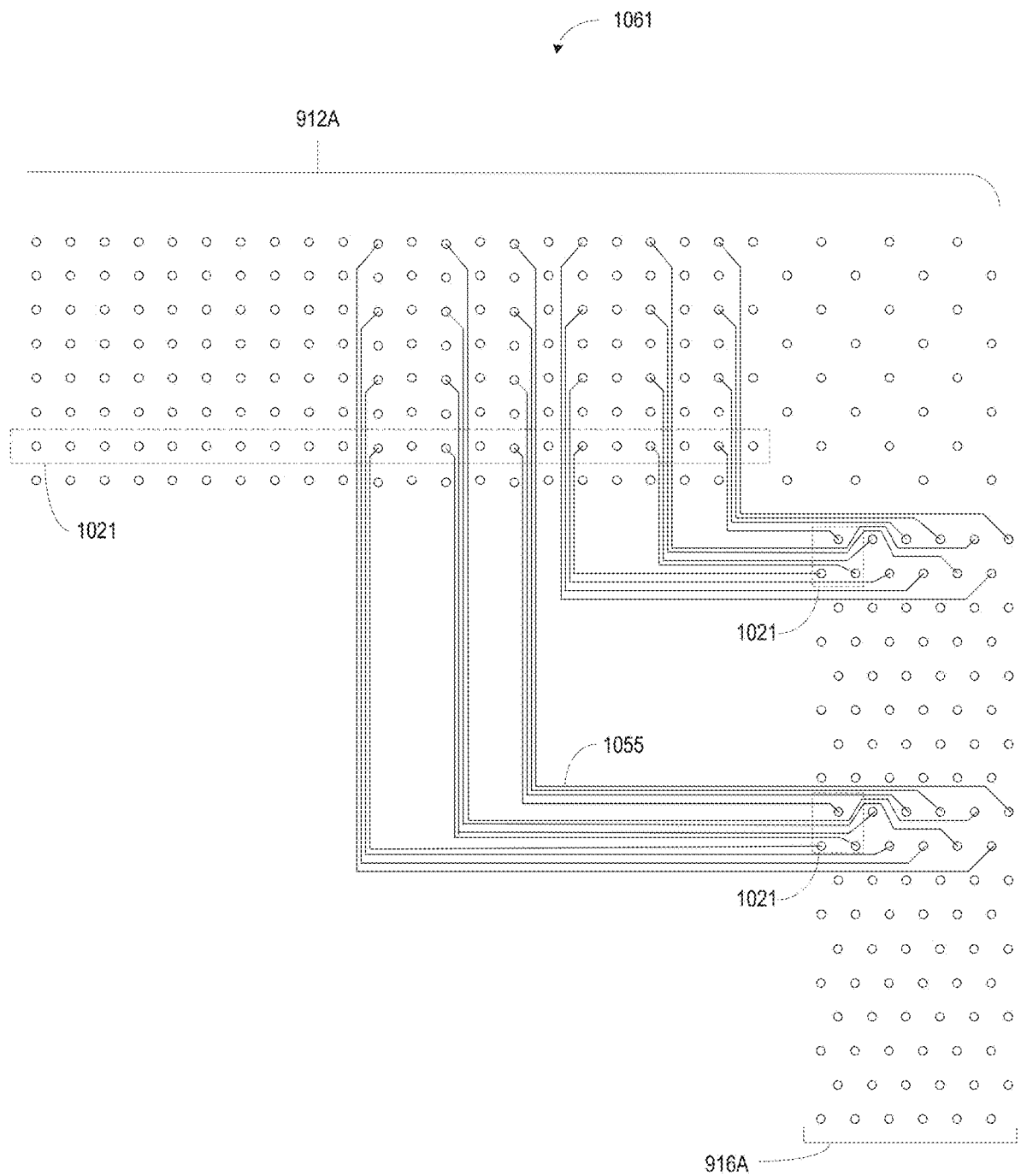
FIG. 10 illustrates generally a first partial detail of a portion of a direct routing layer according to various examples of the present subject matter.

FIG. 10 illustrates generally a detail of a portion of first layer 1061, or sub-layer, of an example routing layer. The portion of the first sub-layer illustrates a portion of an intermediate interface area 916, a portion of a TSV area 912, and wire or traces 1055 electrically coupling a portion of the connections of the intermediate interface area 916 with corresponding connections of the TSV area 912, in the illustrated example, the memory can be configured in channel pairs and group of signals 1021 associated with a first channel pair at the intermediate interface area. 916 can be coupled, via the wire or traces 1055, to a row of TSVs of the TSV area 912 corresponding to the first channel pair. In certain examples, the TSV area can include both control TSVs for the memory stack and power TSVs for the memory stack. In certain examples, the control TSVs can be arranged in rows associated with a channel pair of the memory stack, and the columns can correspond to a stack level of the stacked memory dies. In certain examples, columns of power TSVs can be intermixed in the array of TSVs of the TSV area. In certain examples, other than TS Vs of the routing layer, the routing layer does not include routing for power. In certain examples, TSVs of the routing layer and the communication medium route power vertically from connections on the communication medium directly to the memory stack.

Figure 11:
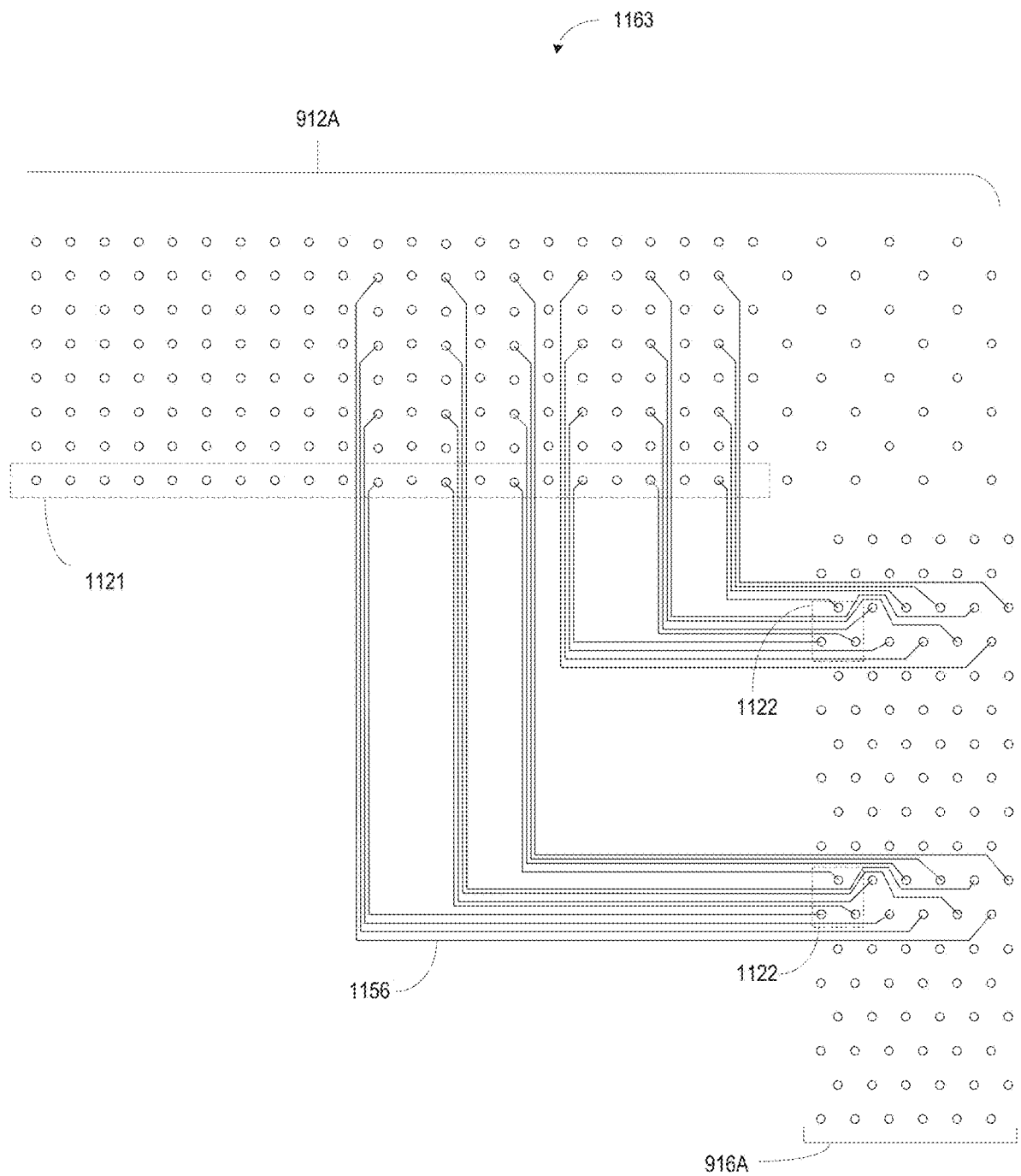
FIG. 11 illustrates generally a second partial detail of the portion of an example direct routing layer according to various examples of the present subject matter.

FIG. 11 illustrates generally a detail of a portion of third layer 1063, or sub-layer, of an example routing layer. The portion of the third layer 1063 of the routing layer illustrates a portion of an intermediate interface area 916, a portion of a TSV area 912, and wire or traces 1156 electrically coupling a portion of the connections of the intermediate interface area 916 with corresponding connections of the TSV area 912. The connections of the intermediate interface area shown in FIG. 11 are coupled, via wire or traces 1156, to TSVs in the same columns as the connected TSVs of FIG. 10. Having two separate layers of the routing layer allows for space efficient routing of the signal between the intermediate interface area 916 and the TSV area 912.

Figure 12:
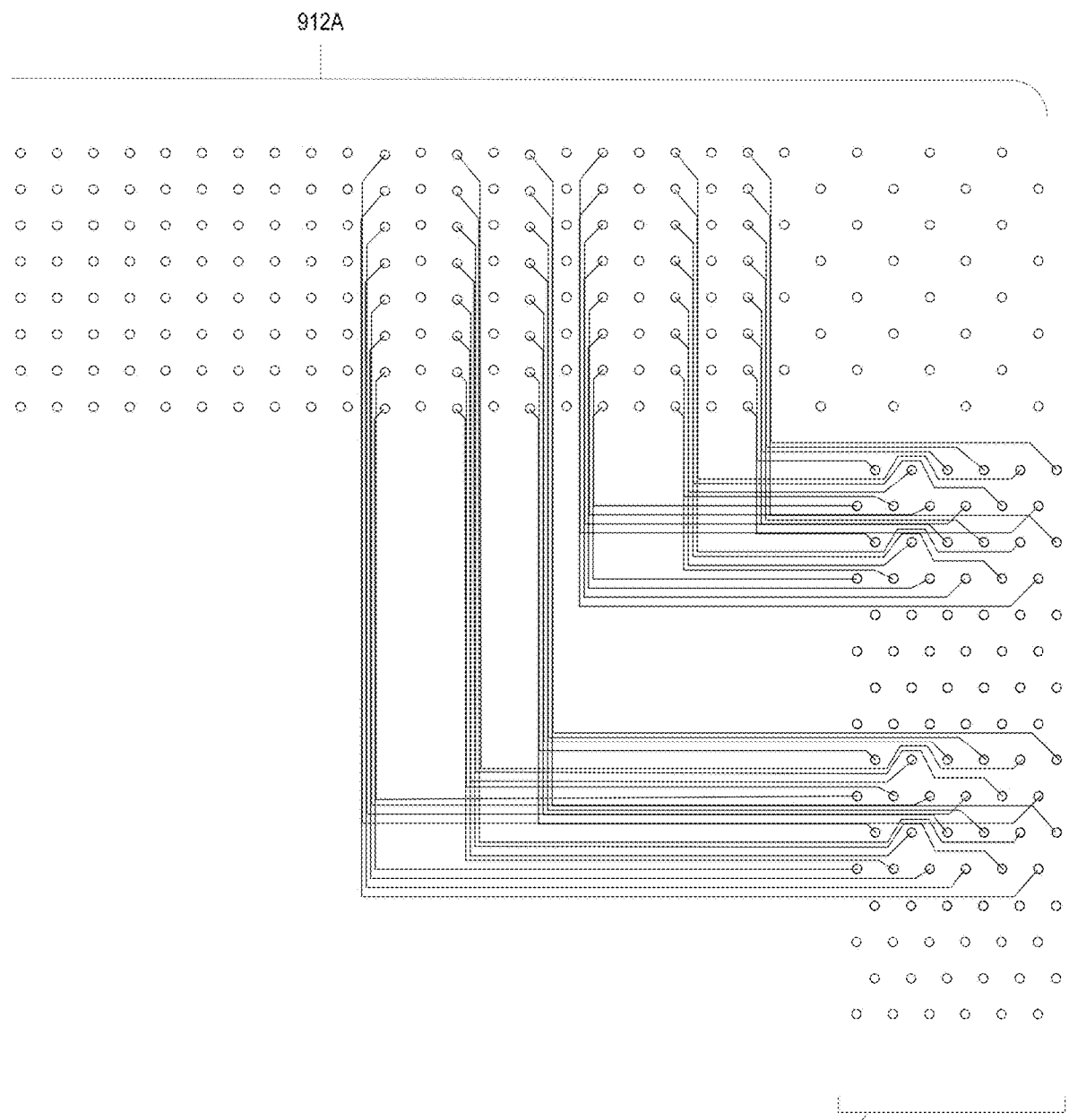
FIG. 12 illustrates generally a third partial detail of the portion of the example direct routing layer according to various examples of the present subject matter.

FIG. 12 illustrates a layover of the first and third sub-layers 1061, 1163 of an example routing layer 906. The first and third layers of the routing layer 906 show wires or traces coupling connections of the intermediate interface area 916A to TSVs of a first TSV area 912A. The routing layer 906 can include a second sub-layer and a fourth sub-layer for routing wires or traces between other connections of the intermediate interface area and a second TSV area 912B (See FIG. 9.)

Figure 13:
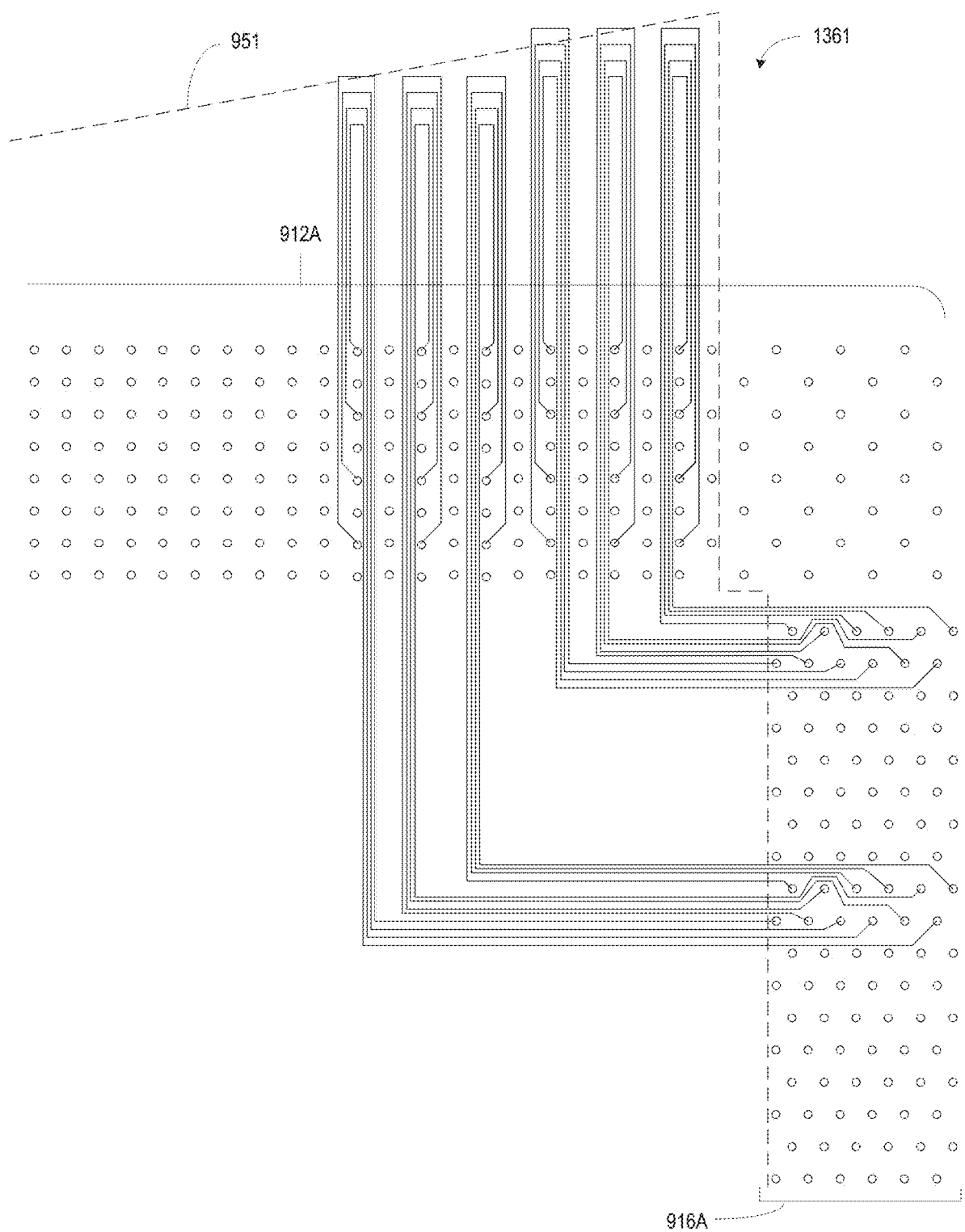
FIG. 13 illustrates generally a first partial detail of a portion of an example direct routing layer including an example length matching routing according to various examples of the present subject matter.

FIG. 13 illustrates a routing scheme of an example sub-layer of a routing layer to have each routing trace of a control signal, or wire, substantially the same length as each other control signal routing trace of each sub-layer of the routing layer. FIG. 13 illustrates a first TSV area 912 and a portion of control signal routing traces of a first sub-layer of the routing layer. The portion of the routing traces are illustrated for coupling control signal TSVs of the TSV area 912A that are located relatively close to the control signal micro-pillar bumps of the intermediate interface area 916A. The routing path of the illustrated traces extend from the intermediate interface area, bypass and overshoot the target TSVs of the TSV area and then return to the target TSVs. For routings that couple distal TSVs of the TSV area to distal micro-pillar bumps or terminations of the intermediate interface area 916A, the overshoot path area or overshoot length area 1322 of the trace route becomes less. Thus, the combined routing areas associated with each TSV area 912A-G of the routing layer 906 define the ramped shapes 951, 952 of FIG. 9, and partially illustrated in FIG. 13.

Figure 14A:
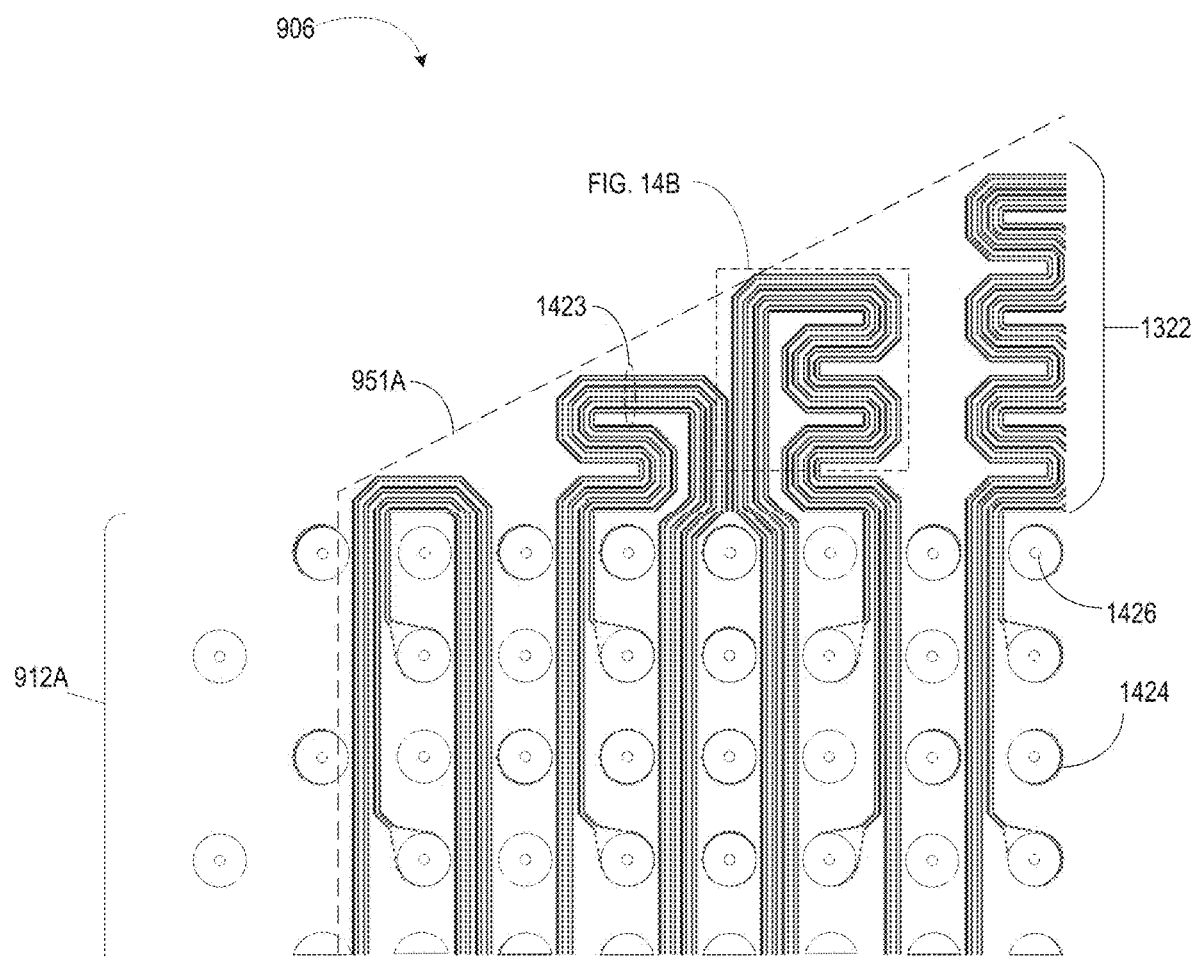
FIGS. 14A and 14B illustrate further details of routing techniques of the routing layer 906.
Figure 14B:
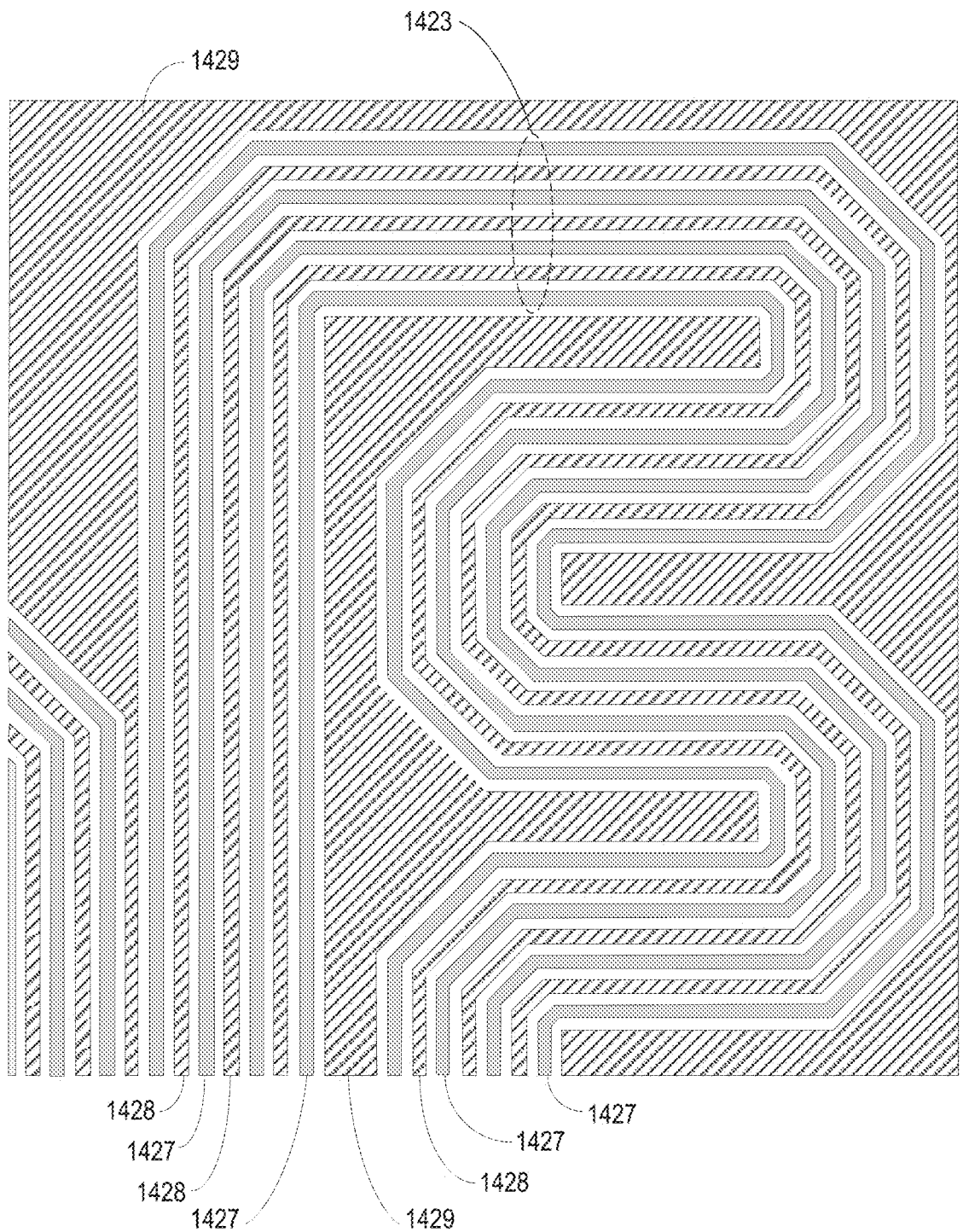

FIGS. 14A and 14B illustrate further details of routing techniques of the routing layer 906. FIG. 14A illustrates generally a serpentine routing layout and paths that can be used to assist in equalizing routing trace lengths of control signals between each termination pads 1424 and TSVs 1426 of the TSV area 912x and a corresponding intermediate interface area (not shown) of the routing layer 906. FIG. 14A illustrates generally a distal end of a TSV area 912x away from the corresponding intermediate interface area 916x where an overshoot length 1322 becomes small. In addition, each group 1423 of traces can include multiple traces 1427 separated from each other by a shield conductor 1428 or shield conductor area 1429 as shown in FIG. 14B. Using the serpentine routing as shown in FIGS. 14A and 14B can assist in reducing the overall overshoot routing areas 951, 952, or can selectively be applied to signal routes to assist in equalizing routing lengths of the control signals between each TSV area 912x and the corresponding intermediate interface area 916x of the routing layer 906.

Figure 15:
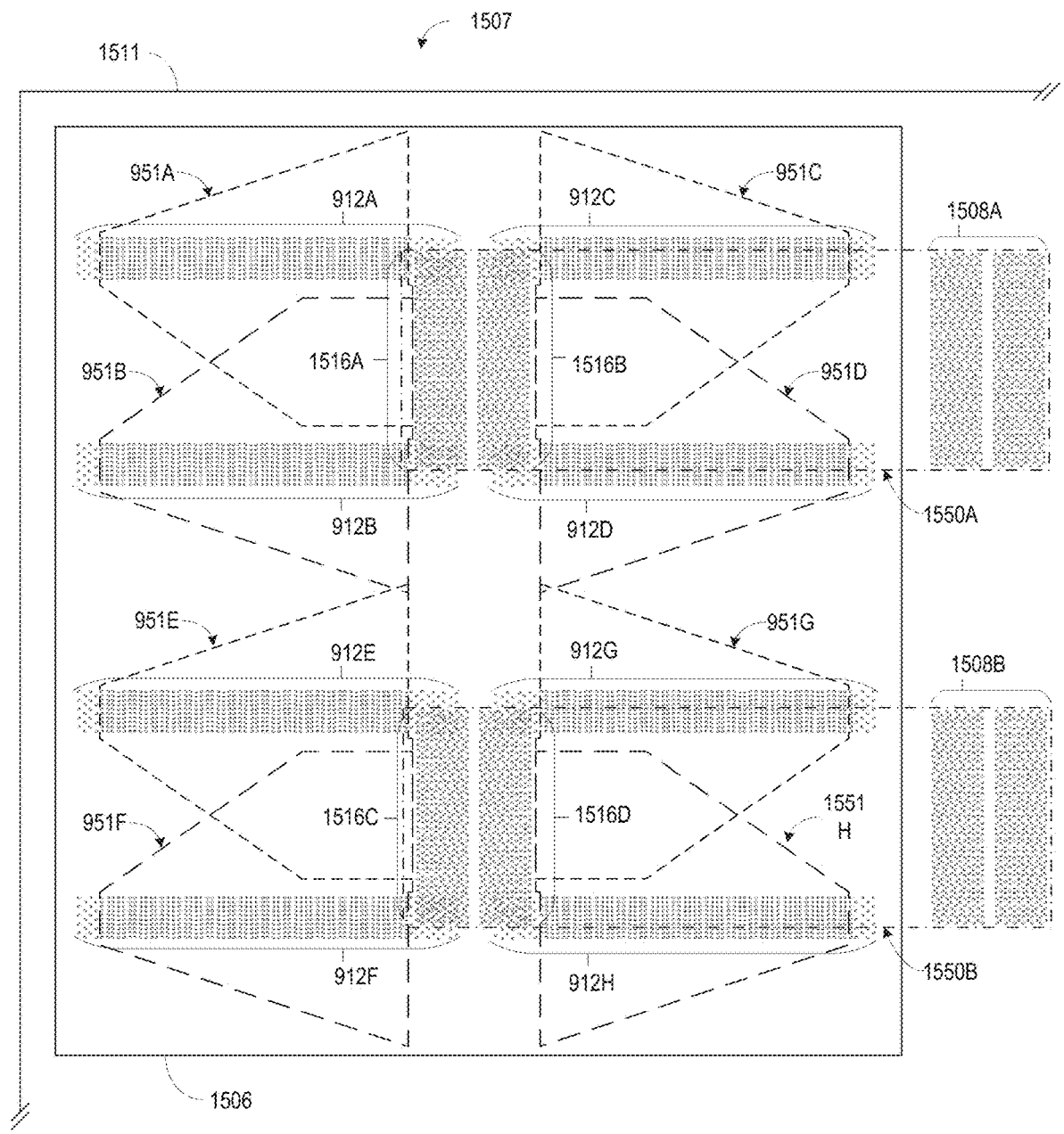
FIG. 15 illustrates generally an example direct routing layer and a portion of an example interposer according to various examples of the present subject matter.

FIG. 15 illustrates generally an example routing assembly 1507 for a memory stack including an alternative routing layer layout and communication medium layout according to various examples of the present subject matter. The routing layer 1506 can include TSV terminations within a number of TSV areas 912A-H. The TSV terminations can be coupled to TSVs of a memory die or a stack of memory dies. The routing layer 1506 can further include routing areas 951, 952 that define approximate boundaries of routing traces coupling the terminations of the TSV areas 912A-H with corresponding routing layer terminations of an intermediate interface area 1516A-D. Unlike the layout of FIG. 9, each intermediate interface area 1516A-D can be larger to support routing power between the communication medium 1511 or host and a logic layer used with legacy memory stacks. In addition, unlike FIG. 9, trace routing areas 1550 of the communication medium 1511, or interposer, can overlap power and signal TSV areas 912A-H of the routing layer 1506.

Figure 16:
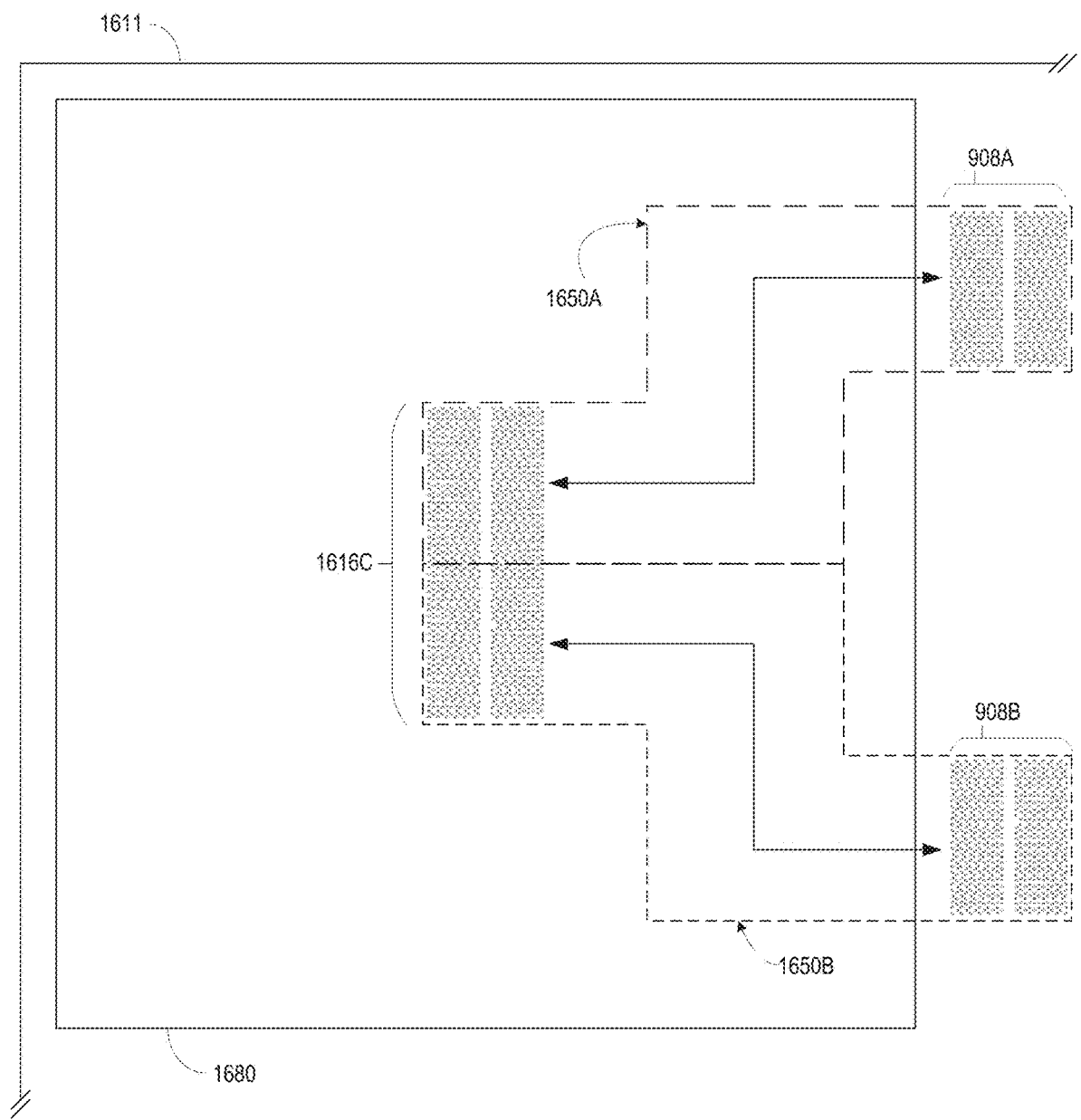
FIG. 16 illustrates generally a partial routing detail of an example interposer for legacy memory stacks to interface with an example split host interface according to various examples of the present subject matter.

FIG. 16 illustrates generally an example routing layout of a portion of an example communication medium. FIG. 16 include the portion of the communication medium 1611, an overlay of a footprint of a legacy memory die 1680 or stack of dies, terminations of an intermediate interface area 1616, termination areas 908A, 908B of a split host interface to the legacy memory. The communication medium 1611 can facilitate coupling legacy memory dies 1680 with the split host interface 908A, 908B. The communication medium 1611 can include a single intermediate interface area 1616, and traces defining two routing areas 1650A, 1650B for coupling terminations of the single intermediate interface area. 1616 with corresponding terminations of the split physical interface areas 908A 908B of the host (not shown).

Figure 17:
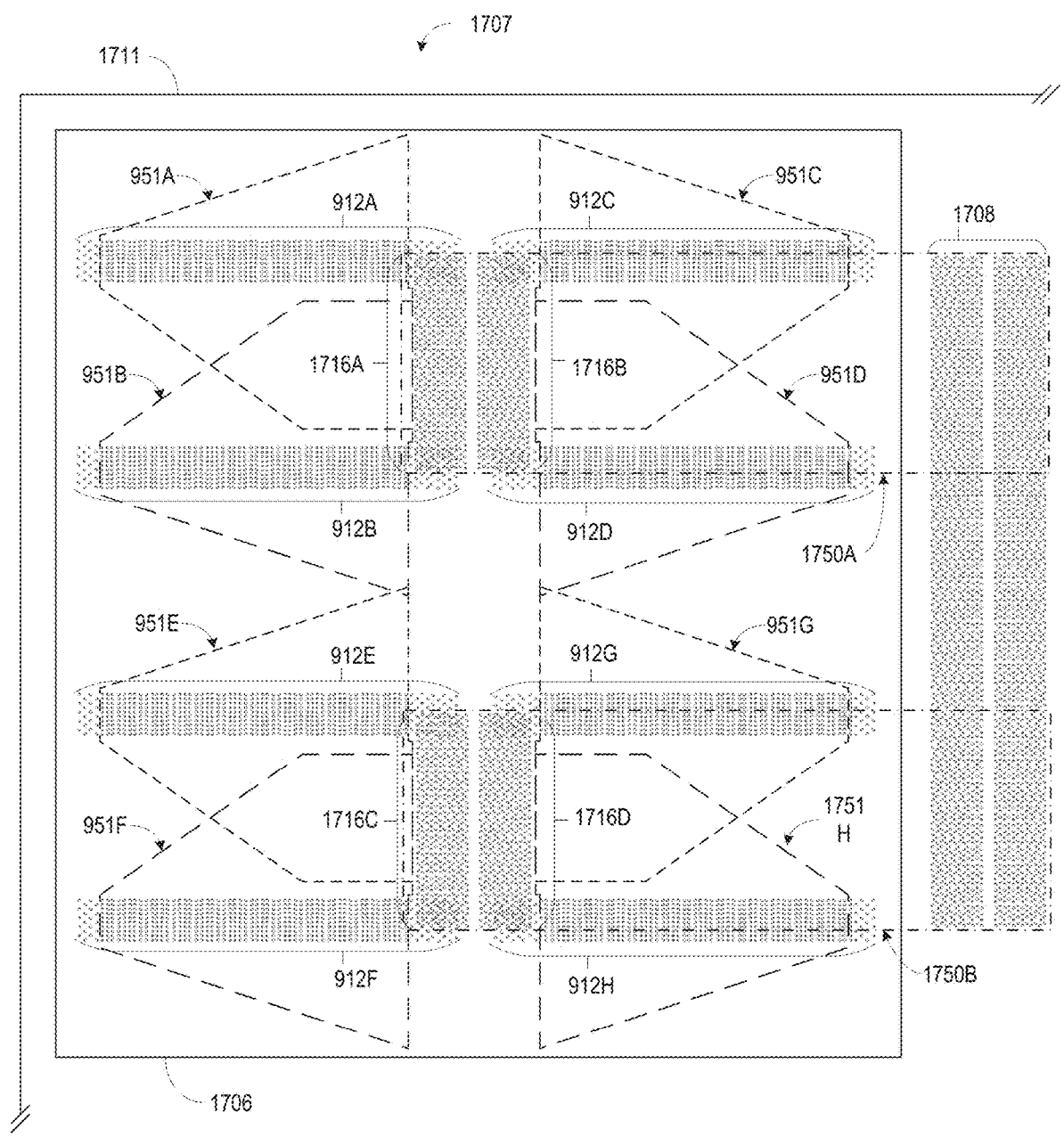
FIG. 17 illustrates generally an example routing assembly to facilitate interfacing a host with faster, power efficient memory.

FIG. 17 illustrates generally an example routing assembly 1707 to facilitate interfacing a host with faster, power efficient memory. The example routing assembly 1707 can include a routing layer 1706 for a memory die or stack of memory die including an alternative routing layer layout, and a communication medium 1711 and communication medium layout according to various examples of the present subject matter. The routing layer 1706 can include TSV terminations within a number of TSV areas 912A-H. The TSV terminations can be coupled to TSVs of a memory die or a stack of memory dies. The routing layer 1706 can further include routing areas 951, 952 that define approximate boundaries of routing traces coupling the terminations of the TSV areas 912A-H with corresponding terminations of an intermediate interface area 1716A-D. Like the layout of FIG. 15, each intermediate interface area 1716A-D can be larger to support routing power via the communication medium 1711 between a host interface 1708 and a logic layer used with legacy memory stacks. In addition, trace routing areas 1750 of the communication medium 1711, or interposer, can overlap power and signal TSV areas 912A-H of the routing layer 1706.

Figure 18:
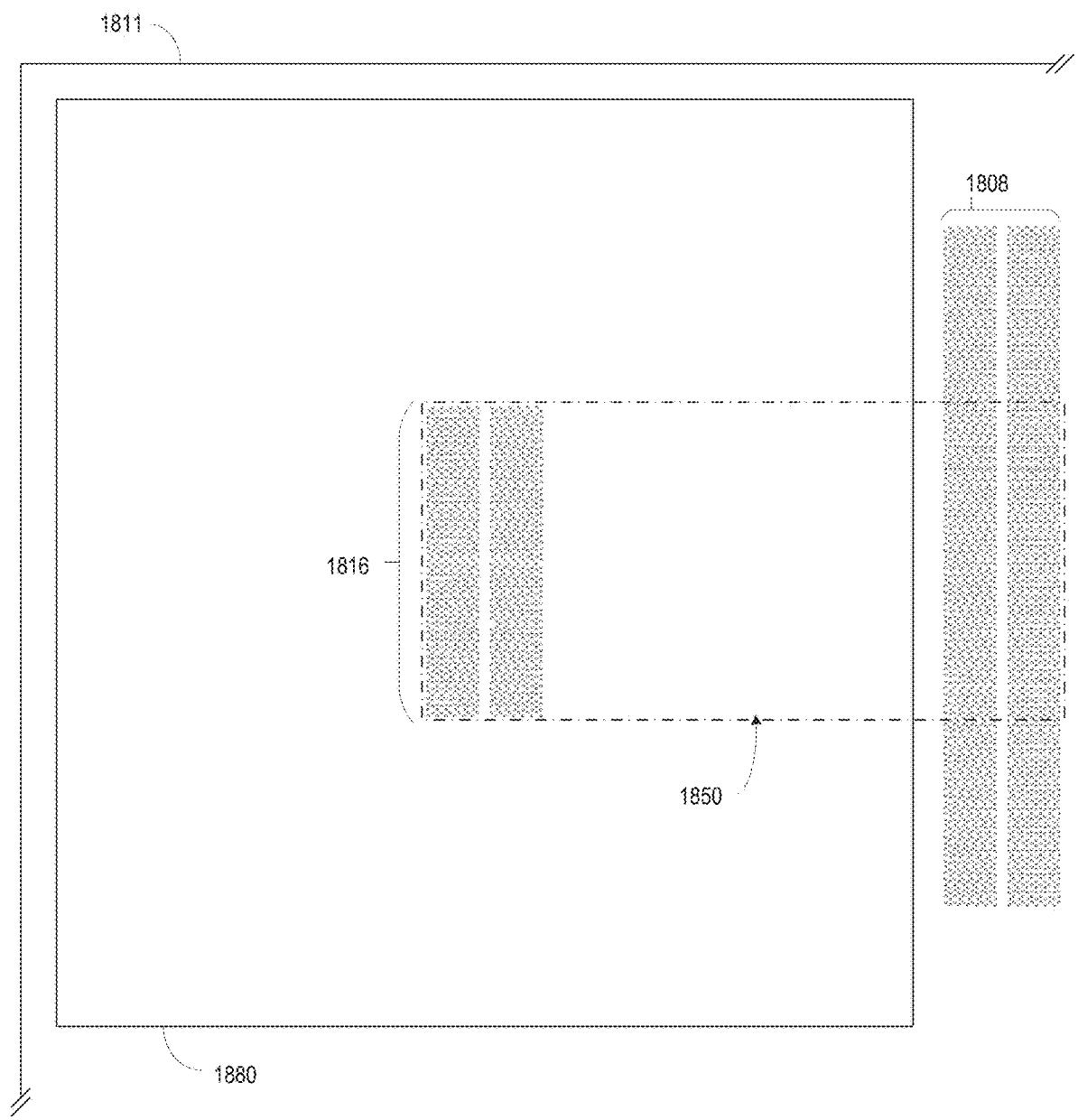
FIG. 18 illustrates generally a communication layer, or interposer, for coupling a logic layer associated with a legacy memory with the new host interface area of the host.

In certain examples, the physical interface area 1708 of the host can be expanded to accommodate an interposer and logic layer for legacy memory dies and legacy memory die stacks. FIG. 18 illustrates generally a communication layer 1811, or interposer, for coupling a logic layer 1880 associated with a legacy memory with the new host interface area 1708 of the host. The communication layer 1811 can include a routing area 1850 for traces connecting terminations of the host interface area 1708 with micro-pillar bumps of an intermediate interface area. 1816 associated with the legacy logic layer 1880 and legacy memory die or stack of legacy memory dies.

Figure 19:
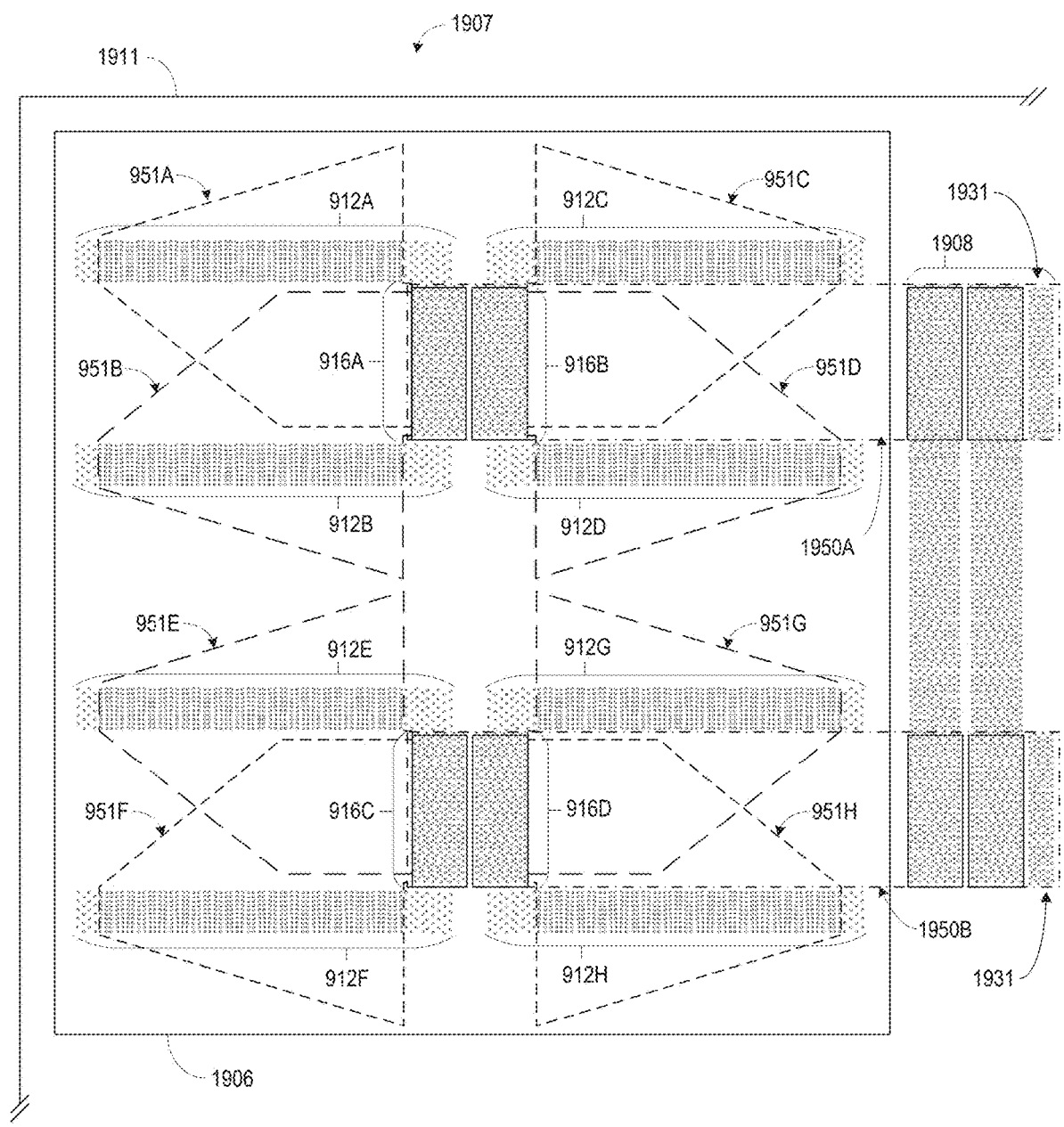
FIG. 19 illustrates generally an example routing assembly to facilitate interfacing a host with faster, power-efficient memory.

FIG. 19 illustrates generally an example routing assembly 1907 to facilitate interfacing a host with faster, power-efficient memory. The routing assembly can include the routing layer 906 of FIG. 9, and an example communication medium 1911 and communication medium layout according to various examples of the present subject matter. The routing layer 906 can include TSV terminations within a number of TSV areas 912A-H. The TSV terminations can be coupled to TSVs of a memory die or a stack of memory dies. The routing layer 906 can further include routing areas 951, 952 that define approximate boundaries of routing traces coupling the terminations of the TSV areas 912A-H with corresponding terminations of an intermediate interface area 916A-D. Each intermediate interface area 916A-D can be sized and located to reduce or eliminate signal routing overlay with the routing areas 1950 of the communication layer 1911.

Figure 20:
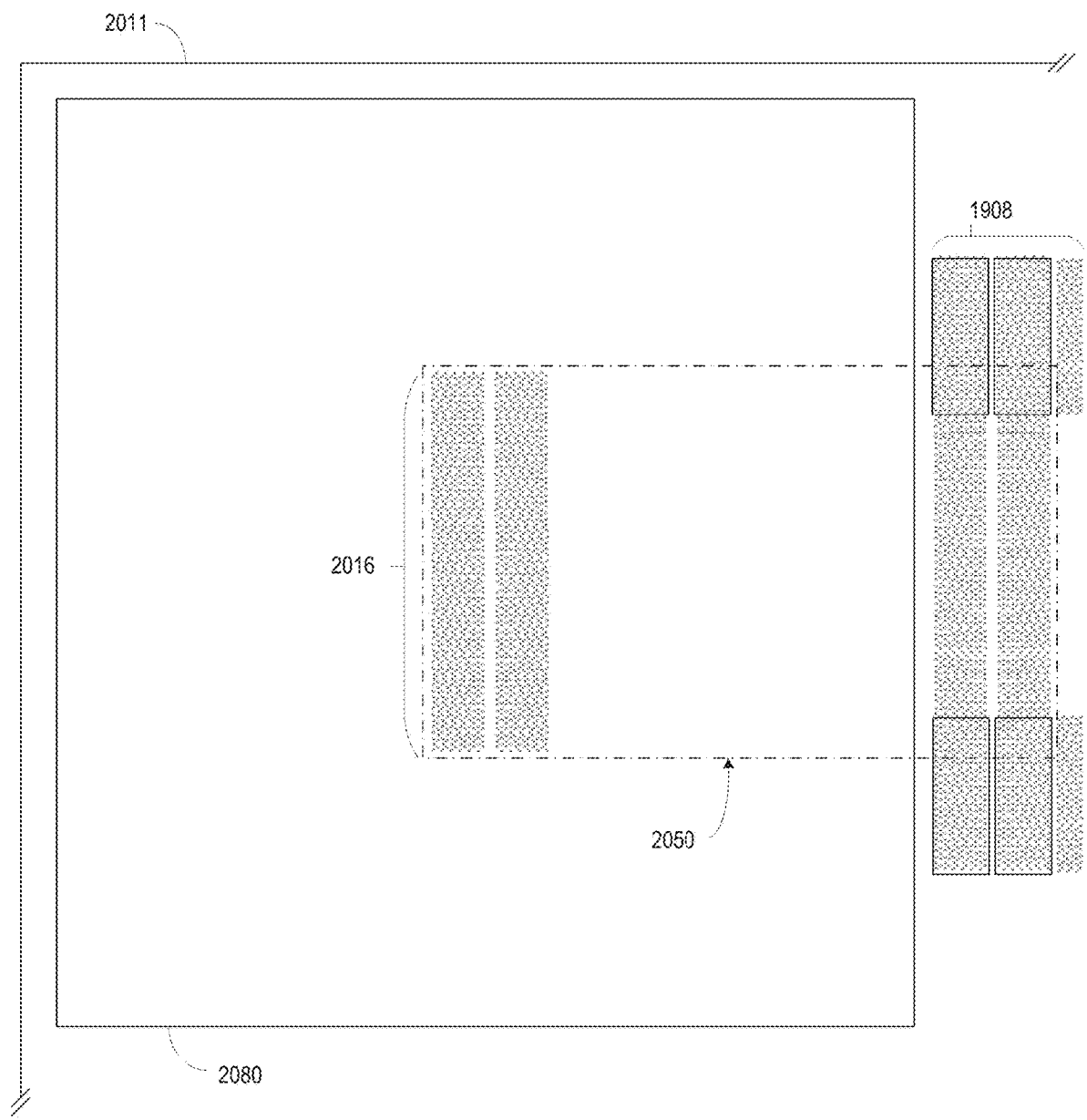
FIG. 20 illustrates generally a communication layer, or interposer, for coupling a logic layer associated with legacy memory with the new physical interface area 1908 of the host.

In certain examples, portions 1931 of the physical interface area 1908 of the host can be widened to facilitate a communication medium 1911 compatible with the routing layer 906 and the faster, power-efficient memory. In addition, the physical interface area 1908 of the host include an interface area to accommodate an interposer and logic layer for legacy memory dies and legacy memory die stacks. FIG. 20 illustrates generally a communication layer 2011, or interposer, for coupling a logic layer 2080 associated with legacy memory with the new physical interface area 1908 of the host. The communication layer 2011 can include a routing area 2050 for traces connecting terminations of the host interface area 1908 with micro-pillar bumps of an intermediate interface area 2016 associated with the legacy logic layer 2080 and a legacy memory die or a stack of legacy memory dies.

Figure 21:
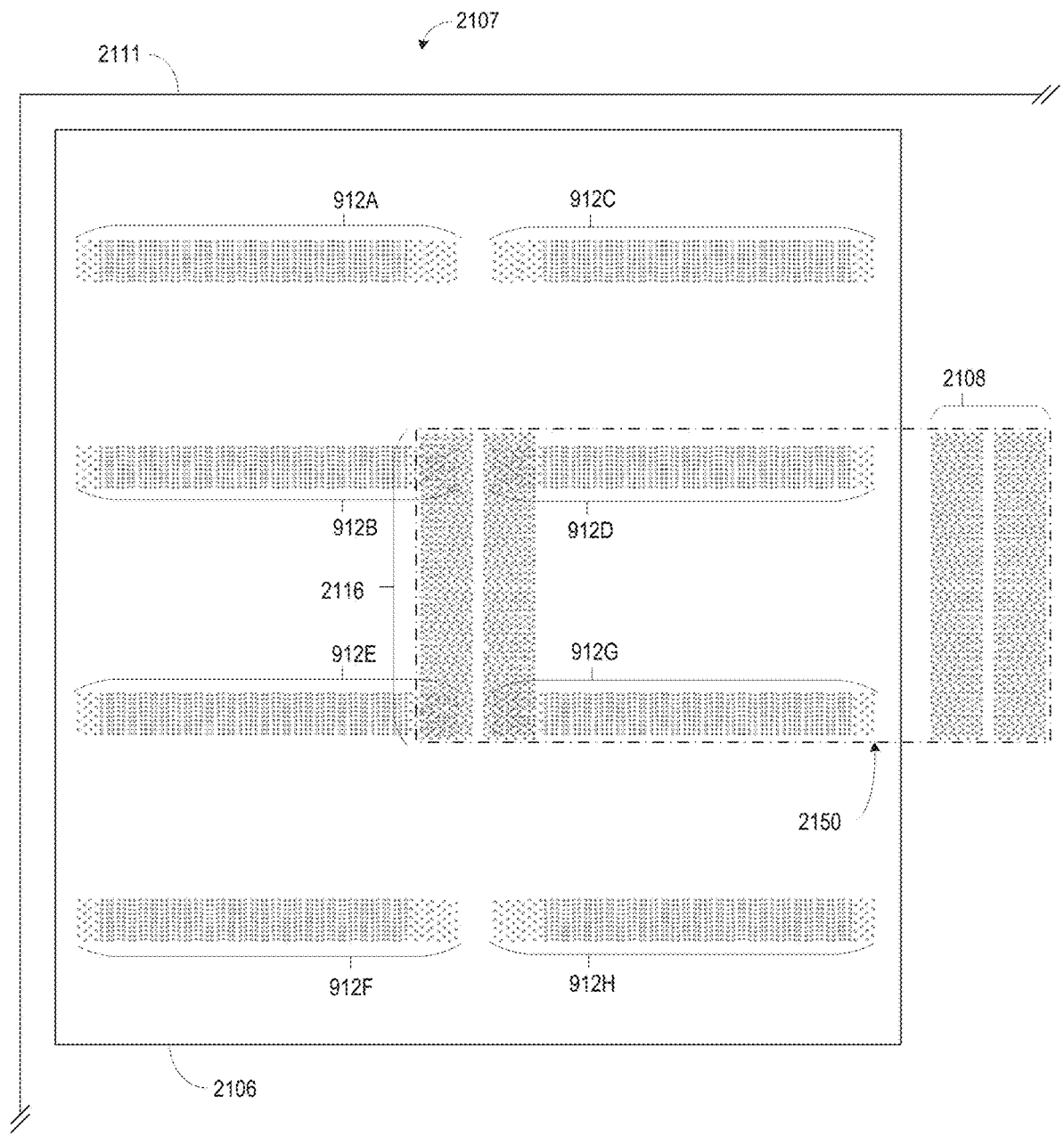
FIG. 21 illustrates routing assembly including a legacy interface configuration overlaying through-silicon-via (TSV) areas of a routing layer associated with faster, power-efficient memory.

FIG. 21 illustrates routing assembly 2107 including a legacy interface configuration overlaying TSV areas 912A-H of a routing layer 2106 associated with faster, power-efficient memory. The layout of FIG. 21 can include a legacy host interface termination area 2108 of a legacy communication medium 2111, a legacy routing area 2150 of the legacy communication medium 2111, an intermediate interface area 2116 for connecting the legacy communication layer 2111 with the routing layer 2106 of the faster, power-efficient memory die or stack of dies and TSV terminations of the TSV areas 912A-H of the routing layer 2106 for interfacing directly with the faster, power-efficient memory dies. Because the intermediate interface area 2116 is located near the center of the two columns of TSV areas (912A, B, E, F and 912C, D, G, H) the routing layer 2106 can have more than 4 routing layers to facilitate connecting micro-pillar bump terminations near the center of the intermediate interface area 2116 with corresponding TSVs of each of the TSV areas 912A-H.

In certain examples, faster, power-efficient memory, faster, power-efficient memory dies, and stacks of faster, power-efficient memory dies include memory dies configured with memory cells arranged in channels or channel-pairs. The channels are configured for parallel communication, not serial communication, to achieve higher throughput with a relatively slower clock compared to memory devices having a serial command, address and/or data bus. In certain examples, a single faster, power-efficient memory die or stack of faster, power-efficient die can include more than 100 channel pairs and more than 1000 control signal connections for interfacing with a host. In certain examples, a routing layer for faster, power-efficient memory does not include a signal line buffer for one or more of the control signals between the memory and the host. The faster, power-efficient memory are arranged to have control signals interface with a direct electrical connection to control signals of the host. Such direct electrical connection can include a termination and traces of a routing layer and a communication medium, but does not include a buffering circuit.

Figure 22:
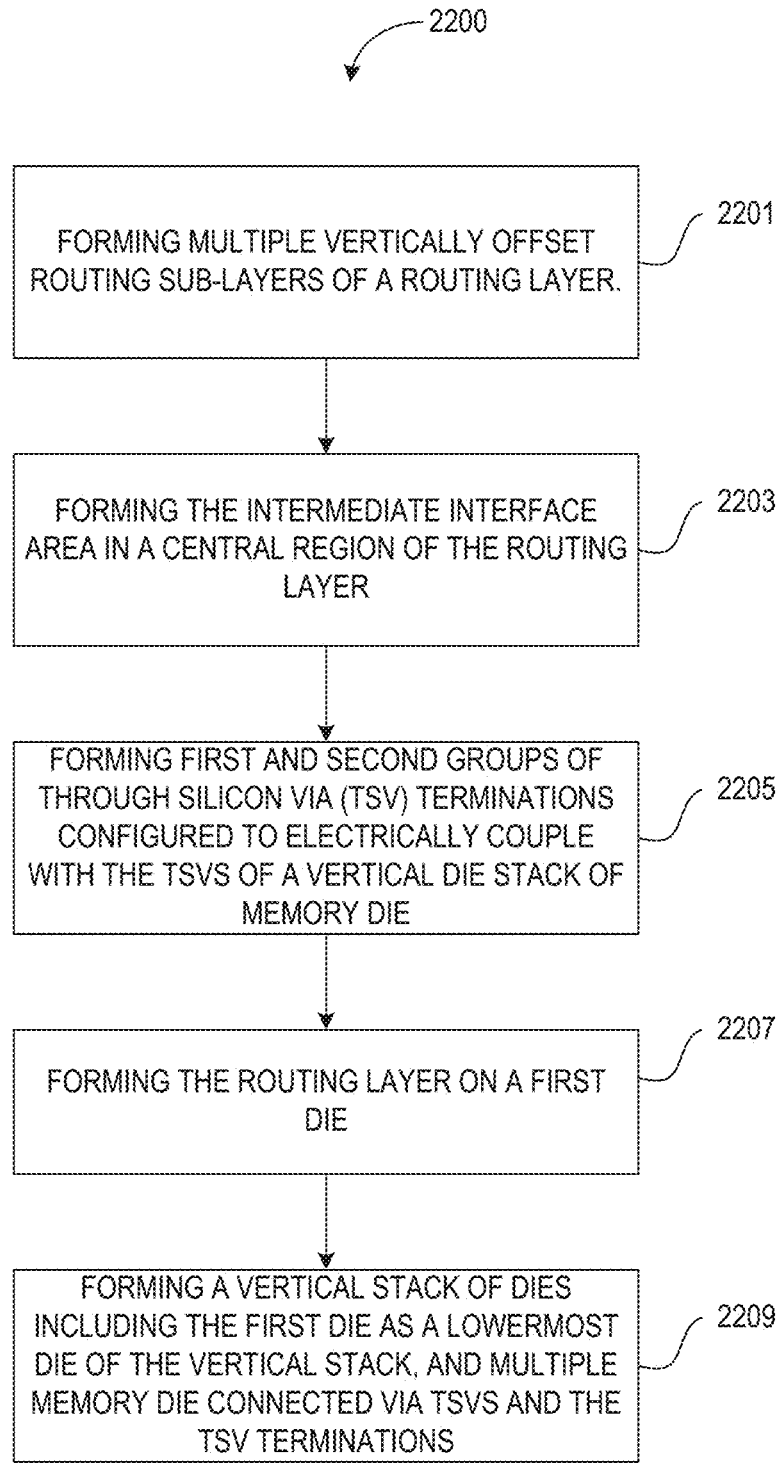
FIG. 22 illustrates generally a flowchart of an example method of making a memory device according to the present subject matter.

FIG. 22 illustrates generally a flowchart of an example method 2200 of making a memory device according to the present subject matter. At 2201, forming multiple vertically offset routing sub-layers of a routing layer. The multiple vertically offset sub-layers can include routing traces coupling TSV terminations of first and second adjacent arrays of TSV terminations with corresponding interface terminations of an intermediate interface area. At 2203, forming the intermediate interface area in a central region of the routing layer. The intermediate interface area can include a plurality of interface terminations, each interface termination configured to couple with a corresponding contact of a semiconductor interposer. In certain examples, the intermediate interface area can extend in the central region and can be located between the first and second adjacent arrays of TSV terminations in a first group of TSV terminations relative to a first axis. At 2205, forming first and second groups of through silicon via (TSV) terminations configured to electrically couple with the TSVs of a vertical die stack of memory die. A first group of TSV terminations can be arranged on a first side of the central region of the routing layer extending along the first axis, and the second group of TSV terminations can be arranged on a second side of the central region. Each group of TSV terminations can include multiple longitudinally extending arrays of TSV terminations. Each array of TSV terminations can extend along a second axis perpendicular to the first axis. At 2207, forming the routing layer on a first die. The routing layer can include the first and second groups of TSVs, the intermediate interface area, and the multiple vertically offset routing sub-layers. At 2209, forming a vertical stack of dies including the first die as a lowermost die of the vertical stack, and multiple memory die connected via TSVs and the TSV terminations. In certain examples, the memory device formed of the vertical stack of memory devices can optionally be secured to a semiconductor interposer. In some examples, the method can further include mounting a processor to the semiconductor interposer such that the processor can be communication with the multiple memory device via the semiconductor interposer and routing layer. Such a processor can be a graphics processor in some examples.

Figure 23:
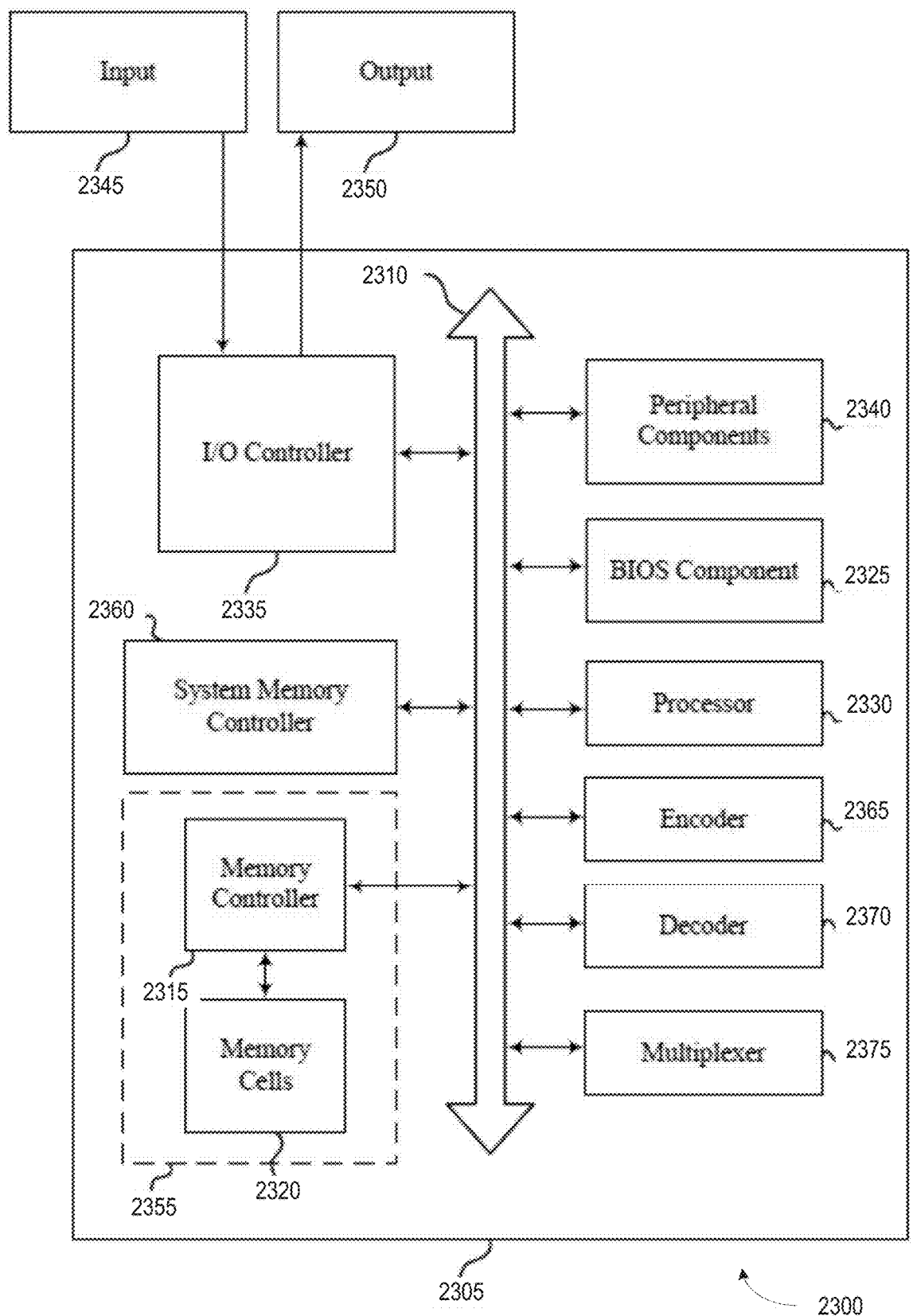
FIG. 23 shows a diagram of a system including a device that supports DRAM in accordance with aspects disclosed herein.

FIG. 23 shows a diagram of a system 2300 including a device 2305 that supports finer grain DRAM in accordance with aspects disclosed herein. Device 2305 may include components for bi-directional voice and data communications including components for transmitting and receiving communications, including memory controller 2315, memory cells 920, basic input/output system (BIOS) component 2325, processor 2330, I/O controller 2335, peripheral components 2340, memory chip 2355, system memory controller 2360, encoder 2365, decoder 2370, and multiplexer 2375. These components may be in electronic communication via one or more busses (e.g., bus 2310). Bus 2310, for example, may have a bus width of 16 data lines ("DQ" lines). Bus 2310 may be in electronic communication with 32 banks of memory cells.

Memory controller 2315 or 2360 may operate one or more memory cells as described herein. Specifically, memory controller may be configured to support flexible multi-channel memory. In some cases, memory controller 2315 or 2360 may operate a row decoder, column decoder, or both, as described with reference to FIG. 1. Memory controller 2315 or 2360 may be in electronic communication with a host and may be configured to transfer data during each of a rising edge and a falling edge of a clock signal of the memory controller 2315 or 2360.

Memory cells 2320 may store information (i.e., in the form of a logical state) as described herein. Memory cells 2320 may represent, for example, memory cells 105 described with reference to FIG. 1. Memory cells 2320 may be in electronic communication with memory controller 2315 or 2360, and memory cells 2320 and memory controller 2315 or 2360 may be located on a chip 2355, which may be one or several planar memory devices as described herein. Chip 2355 may, for example, be managed by system memory controller 2315 or 2360.

Memory cells 2320 may represent a first array of memory cells with a plurality of regions coupled to a substrate. Each region of the plurality of regions may include a plurality of banks of memory cells and a plurality of channels traversing the first array of memory cells. At least one of the plurality of channels may be coupled to at least one region. Memory controller 2315 or 2360 may be configured to transfer data between the coupled region and the memory controller 2315 or 2360.

BIOS component 2325 be a software component that includes BIOS operated as firmware, which may initialize and run various hardware components. BIOS component 2325 may also manage data flow between a processor and various other components, e.g., peripheral components, input/output control component, etc. BIOS component 2325 may include a program or software stored in read only memory (ROM), flash memory, or any other non-volatile memory.

Processor 2330 may include an intelligent hardware device, (e.g., a general-purpose processor, a digital signal processor (DSP), a central processing unit (CPU), a microcontroller, an application-specific integrated circuit (ASIC), an field programmable gate array (FPGA), a programmable logic device, a discrete gate or transistor logic component, a discrete hardware component, or any combination thereof). In some cases, processor 2330 may be configured to operate a memory array using a memory controller 2315 or 2360. In other cases, a memory controller 2315 or 2360 may be integrated into processor 2330. Processor 2330 may be configured to execute computer-readable instructions stored in a memory to perform various functions (e.g., functions or tasks supporting flexible multi-channel memory).

I/O controller 2335 may manage input and output signals for device 2305. I/O controller 2335 may also manage peripherals not integrated into device 2305. In some cases, I/O controller 2335 may represent a physical connection or port to an external peripheral. 110 controller 2335 may utilize an operating system such as iOS®, ANDROID®, MS-DOS®, MS-WINDOWS®, OS/2®, UNIX®, LINUX®, or another known operating system. In other cases, I/O controller 2335 may represent or interact with a modem, a keyboard, a mouse, a touchscreen, or a similar device. In some cases, I/O controller 2335 may be implemented as part of a processor. A user may interact with device 2305 via I/O controller 2335 or via hardware components controlled by I/O controller 2335.

Peripheral components 2340 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 2345 may represent a device or signal external to device 2305 that provides input to device 2305 or its components. This may include a user interface or an interface with or between other devices. In some cases, input 2345 may be managed by I/O controller 2335, and may interact with device 2305 via a peripheral component 2340.

Output 2350 may also represent a device or signal external to device 2305 configured to receive output from device 2305 or any of its components. Examples of output 2350 may include a graphics display, audio speakers, a printing device, another processor or printed circuit board, etc. In some cases, output 2350 may be a peripheral element that interfaces with device 2305 via peripheral component(s) 2340. Output 2350 may be managed by I/O controller 2335.

System memory controller 2315 or 2360 may be in electronic communication with a first array of memory cells (e.g., memory cells 2320). A host may be a component or device that controls or directs operations for a device of which memory controller 2315 or 2360 and corresponding memory array are a part. A host may be a component of a computer, mobile device, or the like. Or device 2305 may be referred to as a host. In some examples, system memory controller 2315 or 2360 is a GPU.

Encoder 2365 may represent a device or signal external to device 2305 that provides performs error correction encoding on data to be stored to device 2305 or its components. Encoder 2365 may write the encoded data to the at least one selected memory via the at least one channel and may also encode data via error correction coding.

Decoder 2370 may represent a device or signal external to device 2305 that sequences command signals and addressing signals to device 2305 or its components. In some examples, memory controller 2315 or 2360 may be co-located within decoder 2370.

Multiplexer 2375 may represent a device or signal external to device 2305 that multiplexes data to device 2305 or its components. Multiplexer 2375 may multiplex the data to be transmitted to the encoder 2365 and de-multiplex data received from the encoder 2365. A multiplexer 2375 may be in electronic communication with the decoder 2370. In some examples, multiplexer 2375 may be in electronic communication with a controller, such as system memory controller 2315 or 2360.

The components of device 2305 may include circuitry designed to carry out their functions. This may include various circuit elements, for example, conductive lines, transistors, capacitors, inductors, resistors, amplifiers, or other active or inactive elements, configured to carry out the functions described herein. Device 2305 may be a computer, a server, a laptop computer, a notebook computer, a tablet computer, a mobile phone, a wearable electronic device, a personal electronic device, or the like. Or device 2305 may be a portion or aspect of such a device. In some examples, device 2305 is an aspect of a computer with high reliability, mission critical, or low latency constraints or parameters, such as a vehicle (e.g., an autonomous automobile, airplane, a spacecraft, or the like). Device 2305 may be or include logic for artificial intelligence (AI), augmented reality (AR), or virtual reality (VR) applications.

In one example, a memory device may include an array of memory cells with a plurality of regions that may each may include a plurality of banks of memory cells, and a plurality of channels traversing the array of memory cells. Each of the channels may be coupled with a region of the array of memory cells and may be configured to communicate signals between the plurality of banks of memory cells in the region with a host device.

In some examples, the memory device may further include I/O areas extending across the array of memory cells, the I/O areas occupying an area of the array of memory cells that may be devoid of memory cells. In some examples of the memory device, the I/O areas may include TSVs configured to couple the array of memory cells with a power node or a ground node.

In some examples, the memory device may further include a plurality of channel interfaces distributed in the array of memory cells. In some examples of the memory device, the plurality of channel interfaces may be bump-outs. In some examples of the memory device, a channel interface of the plurality of channel interfaces may be positioned in each quadrant of the array of memory cells.

In some examples, the memory device may further include a plurality of signal paths extending between memory cells of the region and a channel interface associated with the region. In some examples of the memory device, the channel interface may be positioned in the array of memory cells to minimize a length of the signal paths.

In some examples, the memory device may further include a second array of memory cells stacked on top of the array of memory cells. In some examples of the memory device, the second array of memory cells may have regions that may each include a plurality of banks of memory cells. In some examples, the memory device may further include a second plurality of channels traversing the second array of memory cells. In some examples of the memory device, each of the channels of the second plurality of channels may be coupled with a second region of the second array of memory cells and may be configured to communicate signals between the plurality of banks of memory cells in the second region with the host device.

In some examples, the memory device may further include TSVs extending through the array of memory cells to couple the second array of memory cells with the second plurality of channels. In some examples of the memory device, a channel may establish a point-to-point connection between the region and the host device. In some examples of the memory device, each channel may include four or eight data pins. In some examples of the memory device, the region of the array of memory cells may include eight or more banks of memory cells.

In some examples, the memory device may further include an interface configured for bidirectional communication with the host device. In some examples of the memory device, the interface may be configured to communicate signals modulated using at least one of a NRZ modulation scheme or a PAM4 scheme, or both.

In one example, a memory device may include an array of memory cells with regions that each include a plurality of banks of memory cells, I/O areas extending across the array of memory cells, the I/O areas may include a plurality of terminals configured to route signals to and from the array of memory cells, and a plurality of channels positioned in the I/O areas of the array of memory cells, each of the channels may be coupled with a region of the array of memory cells and may be configured to communicate signals between the plurality of banks of memory cells in the region with a host device.

In some examples, the memory device may further include a plurality of channel interfaces positioned in the I/O areas of the array of memory cells, signal paths couple the regions with the plurality of channel interfaces. In some examples of the memory device, the I/O areas may include TSVs configured to couple a second array of memory cells stacked on top of the array of memory cells with a channel interface.

In some examples of the memory device, a channel interface of the region may be positioned within an I/O area that bisects the region serviced by the channel interface. In some examples of the memory device, the I/O areas may include TSVs configured to couple the array of memory cells with a power node or a ground node. In some examples of the memory device, the I/O areas may occupy an area of the array of memory cells that may be devoid of memory cells. In some examples of the memory device, the array of memory cells may be bisected by two I/O areas. In some examples of the memory device, the array of memory cells may be bisected by four I/O areas.

In one example, a system may include a host device, a memory device including a memory die with a plurality of regions that may each include a plurality of banks of memory cells, and a plurality of channels configured to communicatively couple the host device and the memory device, each of the channels may be coupled with a region of the memory die and may be configured to communicate signals between the plurality of banks of memory cells in the region with the host device.

In some examples, the system may include an interface configured for bidirectional communication with the host device. In some examples of the system, the interface may be configured to communicate signals modulated using at least one of a NRZ modulation scheme or a PAM4 scheme, or both. In some examples of the system, the host device may be an example of a GPU. In some examples of the system, the memory device may be positioned in a same package as the host device.

In one example, a memory device may include an array of memory cells with a plurality of regions that each include a plurality of banks of memory cells, and a plurality of channels traversing the array of memory cells, each of the channels may be coupled to at least one region of the array of memory cells and each channel may include two or more data pins and one or more command/address pin.

In some examples of the memory device, each channel may include two data pins. In some examples of the memory device, each channel may include one command/address pin. In some examples of the memory device, each region of the array may include four banks of memory cells. In some examples of the memory device, each channel may include four data pins. In some examples of the memory device, each channel may include two command/address pins. In some examples of the memory device, each region of the array may include eight banks of memory cells. In some examples of the memory device, each bank of memory cells may be contiguous with a channel.

In some examples of the memory device, a first set of banks of each plurality may be contiguous with a channel and a second set of banks of each plurality may be contiguous with another bank and non-contiguous with a channel. In some examples, the memory device may include 128 data pins and configured with a ratio of two, four, or eight data pins per channel.

In some examples, the memory device may include one, two, three, four, or six command/address pins per channel. In some examples, the memory device may include 256 data pins and configured with a ratio of two, four, or eight data pins per channel. In some examples, the memory device may include one, two, three, four, or six command/address pins per channel. In some examples of the memory device, the array may include a plurality of memory dice that each may include a plurality of channels.

In some examples of the memory device, each memory die of the plurality may be coupled with a different channel of the plurality of channels. In some examples, the memory device may include a buffer layer coupled with array. In some examples, the memory device may include an organic substrate underlying the array.

In some examples of the memory device, the array may be configured for a pin rate of 10, 16, 20, or 24 Gbps. In some examples, the memory device may include an interface configured for bidirectional communication with a host device. In some examples of the memory device, the interface may be configured for at least one of a binary modulation signaling or pulse-amplitude modulation, or both.

In one example, a system may include at least one memory die that may include a plurality of regions that each may include a plurality of banks of memory cells, one or more channels associated with each memory die, each of the channels may be coupled to at least one region of the die of memory cells and each channel may include two or more data pins, and an organic substrate that underlies the memory die.

In some examples, the system may include a host device, and an interface configured for bidirectional communication with the host device, the interface supports at least one of a NRZ signaling or a PAM4, or both. In some examples of the system, the host device may include a GPU.

In some examples, the system may include a plurality of memory arrays that each may include 128 or 256 data pins and configured with a ratio of two, four, or eight data pins per channel. In some examples, the system may include a buffer layer positioned between the at least one memory die and the organic substrate.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As may be used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The may be used herein, the term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. Each layer may have three dimensions height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of a memory array.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. In some examples, the substrate may be an organic build up substrate formed from materials such as ABF or BT. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine.

A processor may also be implemented as a combination of computing devices a combination of a DSP and a microprocessor, multiple microprocessors, one or more microprocessors in conjunction with a DSP core, or any other such configuration).

In a first example, Example 1 is a routing layer for a dynamic random-access memory die (DRAM), the routing layer comprising: multiple through silicon via (TSV) terminations configured to electrically couple with TSVs of the DRAM, the multiple TSV terminations arranged in multiple TSV areas, the multiple TSV areas arranged in two columns; an intermediate interface area including multiple micro-pillar bump terminations configured to couple, via a micro-pillar bump, with corresponding micro-pillar bump terminations of a semiconductor interposer, the intermediate interface area arranged between the two columns and also located between two adjacent TSV areas, of the multiple TSV areas, within one column of the two columns; and multiple routing traces coupling each control TSV termination of the two adjacent TSV areas with a corresponding micro-pillar bump termination of the intermediate interface.

In Example 2, the routing layer of Example 1 optionally includes no more than four routing layers, each routing layer including a portion of the plurality of routing traces.

In Example 3, the routing layer of any one or more of Examples 1-2 optionally does not include a buffer configured to buffer a signal of one or more of the routing traces of the plurality of routing traces.

In Example 4, the multiple routing traces of any pone or more of Examples 1-3 optionally includes a second multiple routing traces having an overshoot path configured to equalize trace lengths of routing trace of the multiple routing traces.

In Example 5, the overshoot path of any one or more of Examples 1-5 optionally includes a serpentine path of one or more of the second multiple routing traces.

In Example 6, the multiple routing traces of any one or more of Examples 1-5 optionally includes shielded routing traces.

Example 7 is a dynamic random-access memory device, comprising: a vertical die stack including multiple dynamic random-access memory (DRAM) die interconnected by through silicon vias (TSVs); a routing layer formed on a lowermost die within the vertical die stack, the routing layer comprising, first and second groups of through silicon via (TSV) terminations configured to electrically couple with the TSVs of the vertical die stack, a first group of TSV terminations arranged on a first side of a central region of the routing layer extending along a first axis, and the second group of TSV terminations arranged on a second side of the central region, wherein each group of TSV terminations includes, multiple longitudinally extending arrays of TSV terminations, wherein each array of TSV terminations extends along a second axis perpendicular to the first axis; a intermediate interface area in the central region, the intermediate interface area including a plurality of interface terminations, each interface termination configured to couple with a corresponding contact of a semiconductor interposer, the intermediate interface area extending in the central region, and also located between first and second adjacent arrays of TSV terminations in the first group of TSV terminations relative to the first axis; and multiple routing traces in the routing layer coupling TSV terminations of the first and second adjacent arrays of TSV terminations with corresponding interface terminations of the intermediate interface area, wherein the routing traces are located in multiple vertically offset layers of the routing layer.

In Example 8, the routing layer of any one or more of Examples 1-7 optionally includes no more than four routing layers, each routing layer including a portion of the plurality of routing traces.

In Example 9, the routing layer of any one or more of Examples 1-8 optionally does not include a buffer configured to buffer a signal of one or more of the routing traces of the plurality of routing traces.

In Example 10, the multiple routing traces of any one or more of Examples 1-9 optionally include a second multiple routing traces having an overshoot path configured to equalize trace lengths of routing trace of the multiple routing traces.

In Example 11, the overshoot path of any one or more of Examples 1-10 optionally includes a serpentine path of one or more of the second multiple routing traces.

In Example 12, the multiple routing traces of any one or more of Examples 1-11 optionally includes shielded routing traces.

Example 13 is a method that can include forming multiple vertically offset routing sub-layers of a routing layer, forming the intermediate interface area in a central region of the routing layer, forming first and second groups of through silicon via (TSV) terminations configured to electrically couple with the TSVs of a vertical die stack of memory die, forming the routing layer on a first die, and forming a vertical stack of dies including the first die as a lowermost die of the vertical stack, and multiple memory die connected via TSVs and the TSV terminations.

Example 14 is a routing layer for a dynamic random-access memory die (DRAM), the routing layer comprising: multiple through silicon via (TSV) terminations configured to electrically couple with TSVs of the DRAM, the multiple TSV terminations arranged in multiple TSV areas, the multiple TSV areas arranged in two columns; an intermediate interface area including multiple micro-pillar bump terminations configured to couple, via a micro-pillar bump, with corresponding micro-pillar bump terminations of a semiconductor interposer, the intermediate interface area arranged between the two columns and also located between two adjacent TSV areas, of the multiple TSV areas, within one column of the two columns; and multiple routing traces coupling each control TSV termination of the two adjacent TSV areas with a corresponding micro-pillar bump termination of the intermediate interface.

In Example 15, the routing layer of any one or more of Examples 1-14 optionally includes no more than four routing layers, each routing layer including a portion of the plurality of routing traces.

In Example 16, the routing layer of any one or more of Examples 1-15 optionally does not include a buffer configured to buffer a signal of one or more of the routing traces of the plurality of routing traces.

In Example 17, the multiple routing traces of any one or more of Examples 1-16 optionally include a second multiple routing traces having an overshoot path configured to equalize trace lengths of routing traces of the multiple routing traces.

In Example 18, the overshoot path of any one or more of Examples 1-17 optionally includes a serpentine path of one or more of the second multiple routing traces.

In Example 19, the multiple routing traces of any one or more of Examples 1-18 optionally includes shielded routing traces.

Example 20 is a random-access memory device that can include a vertical die stack including multiple memory die interconnected by through silicon vias (TSVs); a routing layer formed on a lowermost die within the vertical die stack, the routing layer comprising, first and second groups of through silicon via (TSV) terminations configured to electrically couple with the TSVs of the vertical die stack, a first group of TSV terminations arranged on a first side of a central region of the routing layer extending along a first axis, and the second group of TSV terminations arranged on a second side of the central region, wherein each group of TSV terminations includes, multiple longitudinally extending arrays of TSV terminations, wherein each array of TSV terminations extends along a second axis perpendicular to the first axis; a intermediate interface area in the central region, the intermediate interface area including a plurality of interface terminations, each interface termination configured to couple with a corresponding contact of a semiconductor interposer, the intermediate interface area extending in the central region, and also located between first and second adjacent arrays of TSV terminations in the first group of TSV terminations relative to the first axis; and multiple routing traces in the routing layer coupling TSV terminations of the first and second adjacent arrays of TSV terminations with corresponding interface terminations of the intermediate interface area, wherein the routing traces are located in multiple vertically offset layers of the routing layer.

In Example 21, the routing layer of any one or more of Examples 1-20 optionally includes no more than four routing layers, each routing layer including a portion of the plurality of routing traces.

In Example 22, the routing layer of any one or more of Examples 1-21 optionally does not include a buffer configured to buffer a signal of one or more of the routing traces of the plurality of routing traces.

In Example 23, the multiple routing traces of any one or more of Examples 1-22 optionally include a second multiple routing traces having an overshoot path configured to equalize trace lengths of routing trace of the multiple routing traces. In Example 24, the overshoot path of any one or more of Examples 1-23 optionally includes a serpentine path of one or more of the second multiple routing traces.

In Example 25, the multiple routing traces of any one or more of Examples 1-24 optionally includes shielded routing traces.

In Example 26, the multiple-memory die of any one or more of Examples 1-25 optionally include dynamic random-access memory (DRAM) die.

Example 27 is an apparatus that can include a semiconductor interposer including routing traces between an intermediate interface and a host interface; a graphics processor integrated circuit mounted to the semiconductor interposer and including electrical connections coupled to host terminations of the host interface of the semiconductor interposer; a plurality of memory device mounted to the semiconductor interposer and configured to provide memory for the graphics processor, wherein each memory device includes, a stack of one or more finer-grain dynamic random-access memory (DRAM) dies; and wherein a first finer-grain DRAM of each stack includes means for coupling multiple through-silicon-via (TSV) areas of the stack with the intermediate interface of the semiconductor interposer.

In Example 28, wherein the first finer-grain DRAM of any one or more of Examples 1-27 optionally includes: multiple through silicon via (TSV) terminations configured to electrically couple with the TSVs of the stack, the TSV terminations arranged in multiple TSV areas, the multiple TSV areas arranged in two columns; an intermediate interface area including multiple micro-pillar bump terminations configured to couple, via a micro-pillar bump, with corresponding micro-pillar bump terminations of the semiconductor interposer, the intermediate interface area arranged between the two columns and also located between two adjacent TSV areas, of the multiple TSV areas, within one column of the two columns; and multiple routing traces coupling each control TSV termination of the two adjacent TSV areas with a corresponding micro-pillar bump termination of the intermediate interface.

In Example 29, the first finer-grain DRAM of any one or more of Examples 1-28 optionally includes no more than four routing layers, each routing layer including a portion of the plurality of routing traces.

In Example 30, the first finer-grain DRAM of any one or more of Examples 1-29 optionally does not include a buffer configured to buffer a signal of one or more of the routing traces of the plurality of routing traces.

In Example 31, the multiple routing traces of any one or more of Examples 1-30 optionally include a second multiple routing traces having an overshoot path configured to equalize trace lengths of routing traces of the multiple routing traces.

In Example 32, the overshoot path of any one or more of Examples 1-31 optionally includes a serpentine path of one or more of the second multiple routing traces.

In Example 33, the multiple routing traces of any one or more of Examples 1-32 optionally includes shielded routing traces.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

The invention claimed is:

1. A random-access memory device, comprising:
   a vertical die stack including multiple memory die interconnected by through silicon vias (TSVs);
   a routing layer formed on a lowermost die within the vertical die stack, the routing layer comprising,
   first and second groups of through silicon via (TSV) terminations configured to electrically couple with the TSVs of the vertical die stack, a first group of TSV terminations arranged on a first side of a central region of the routing layer extending along a first axis, and the second group of TSV terminations arranged on a second side of the central region, wherein each group of TSV terminations includes multiple longitudinally extending arrays of TSV terminations, wherein each array of TSV terminations extends along a second axis perpendicular to the first axis;
   a intermediate interface area in the central region, the intermediate interface area including a plurality of interface terminations, each interface termination configured to couple with a corresponding contact of a semiconductor interposer, the intermediate interface area extending in the central region, and also located between first and second adjacent arrays of TSV terminations in the first group of TSV terminations relative to the first axis; and
   multiple vertically offset routing sub-layers of the routing layer, the multiple vertically offset sub-layers comprising routing traces coupling TSV terminations of the first and second adjacent arrays of TSV terminations with corresponding interface terminations of the intermediate interface area.

2. The random-access memory device of claim 1, wherein the routing layer includes no more than four vertically offset routing sub-layers, each routing sub-layer including a portion of the multiple routing traces.

3. The random-access memory device of claim 1, wherein the routing layer does not include a buffer configured to buffer a signal of one or more of the routing traces of the plurality of routing traces.

4. The random-access memory device of claim 1, wherein the multiple routing traces include second multiple routing traces having an overshoot path configured to equalize trace lengths of a plurality of routing traces of the multiple routing traces.

5. The random-access memory device of claim 4, wherein the overshoot path includes a serpentine path of one or more of the second multiple routing traces.

6. The random-access memory device of claim 1, wherein the multiple routing traces include shielded routing traces.

7. The random-access memory device of claim 1, wherein the multiple-memory die include multiple dynamic random-access memory (DRAM) die.

8. An apparatus comprising:
   a semiconductor interposer including routing traces between an intermediate interface and a host interface;
   a processor integrated circuit mounted to the semiconductor interposer and including electrical connections coupled to host terminations of the host interface of the semiconductor interposer;
   a plurality of memory devices mounted to the semiconductor interposer and configured to provide memory for a graphics processor, wherein each memory device includes a stack of multiple dynamic random-access memory (DRAM) dies, the stack of DRAM dies having multiple TSVs; and
   wherein a first DRAM of each stack includes,
      multiple through silicon via (TSV) terminations configured to electrically couple with the TSVs of the stack, the TSV terminations arranged in multiple TSV areas, the multiple TSV areas arranged in two columns,
      an intermediate interface area including multiple micro-pillar bump terminations configured to couple, via a micro-pillar bump, with corresponding micro-pillar bump terminations of the semiconductor interposer, the intermediate interface area arranged between the two columns and also located between two adjacent TSV areas, of the multiple TSV areas, within one column of the two columns; and
      multiple routing traces coupling each control TSV termination of the two adjacent TSV areas with a corresponding micro-pillar bump termination of the semiconductor interposer at the intermediate interface area.

9. The apparatus of claim 8, wherein the first DRAM includes no more than four routing sub-layers, each routing sub-layer including a portion of the plurality of routing traces.

10. The apparatus of claim 8, wherein the first DRAM does not include a buffer configured to buffer a signal of one or more of the routing traces of the plurality of routing traces.

11. The apparatus of claim 8, wherein the multiple routing traces include a second multiple routing traces having an overshoot path configured to equalize trace lengths of a plurality of routing traces of the multiple routing traces.

12. The apparatus of claim 11, wherein the overshoot path includes a serpentine path of one or more of the multiple routing traces.

13. The apparatus of claim 8, wherein the multiple routing traces include multiple shielded routing traces.

* * * * *